US008042070B2

(12) United States Patent
Culp et al.

(10) Patent No.: US 8,042,070 B2
(45) Date of Patent: Oct. 18, 2011

(54) METHODS AND SYSTEM FOR ANALYSIS AND MANAGEMENT OF PARAMETRIC YIELD

(75) Inventors: James A. Culp, Newburgh, NY (US); Paul Chang, Mahopac, NY (US); Dureseti Chidambarrao, Weston, CT (US); Praveen Elakkumanan, White Plains, NY (US); Jason Hibbeler, Williston, VT (US); Anda C. Mocuta, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 874 days.

(21) Appl. No.: 11/876,853

(22) Filed: Oct. 23, 2007

(65) Prior Publication Data

US 2009/0106714 A1 Apr. 23, 2009

(51) Int. Cl.
*G06F 17/50* (2006.01)
(52) U.S. Cl. .............................. 716/56; 716/51; 716/54
(58) Field of Classification Search .................. 716/2, 4, 716/51, 54, 56
See application file for complete search history.

(56) References Cited

U.S. PATENT DOCUMENTS

| 2002/0193892 A1* | 12/2002 | Bertsch et al. ............ 700/31 |
| 2008/0005707 A1* | 1/2008 | Papanikolaou et al. ........ 716/4 |
| 2008/0231307 A1* | 9/2008 | Bickford et al. ........... 324/765 |
| 2009/0031271 A1* | 1/2009 | White et al. ............... 716/10 |

OTHER PUBLICATIONS

Cox et al.; "Statistical modeling for efficient parametric yield estimation of MOS VLSI circuits"; Feb. 1985; IEEE Transactions on Electron Devices; pp. 471-478.*
Rao et al; "Parametric Yield Estimation Considering Leakage Variability"; 2004; Design Automation Conference, 41st Conference; pp. 442-447.*
Kim et al.; "Dynamic Vth Scaling Scheme for Active Leakage Power Reduction"; 2002; Department of Electrical and Computer Engineering at Purdue University; pp. 1-5.*

* cited by examiner

*Primary Examiner* — Suresh Memula
(74) *Attorney, Agent, or Firm* — Scully, Scott, Murphy & Presser, P.C.; H. Daniel Schnurmann

(57) ABSTRACT

Impact on parametric performance of physical design choices for transistors is scored for on-current and off-current of the transistors. The impact of the design parameters are incorporated into parameters that measure predicted shift in mean on-current and mean off-current and parameters that measure predicted increase in deviations in the distribution of on-current and the off-current. Statistics may be taken at a cell level, a block level, or a chip level to optimize a chip design in a design phase, or to predict changes in parametric yield during manufacturing or after a depressed parametric yield is observed. Further, parametric yield and current level may be predicted region by region and compared with observed thermal emission to pinpoint any anomaly region in a chip to facilitate detection and correction in any mistakes in chip design.

20 Claims, 9 Drawing Sheets

METHODS AND SYSTEM FOR ANALYSIS AND MANAGEMENT OF PARAMETRIC YIELD

FIELD OF THE INVENTION

The present invention relates to methods and systems for analyzing and improving parametric yield in semiconductor device manufacturing.

BACKGROUND OF THE INVENTION

With continual scaling of dimensions in semiconductor devices and increase in the number of gates per chip, yield management in semiconductor manufacturing has become critical for economical and profitable operation of chip manufacturing facilities. Referring to FIG. 1, past trends up to 65 nm technology node and forecast for future technology nodes show three components of yield loss including random defect yield loss, process limited yield loss, and parametric yield loss.

Random defect yield loss is the yield loss due to random defects generated during manufacturing of a semiconductor chip. As feature sizes shrink in a semiconductor chip, functionality of the semiconductor chip is more readily disturbed by random defects generated during semiconductor processing steps, resulting in increased in the random defect yield loss in successive technology generation. While the impact of random defects on yield becomes more severe in successive technology generations, semiconductor chip manufacturing facility automation and process enhancements tend to reduce generation of random defects and mitigate the increase in the random defect yield loss.

Process limited yield loss is the yield loss due to failure to control process parameters within specification. Process limited yield loss is thus due to an out-of-specification process parameter such as a thickness of a film, recess depth of a structure in a semiconductor substrate, and composition of a material. Inherent variability in semiconductor manufacturing processes causes some semiconductor chips to be out-of-specification for at least one process parameter. If the out of spec condition results in a short or open due then the chip is said to suffer from Process limited yield. Note, not all out of spec process parameters result in process limited yield. Increase in complexity of processing steps contributes to increase in the process limited yield loss, while improvement in process control tends to mitigate the impact of the processing steps on the process limited yield.

Parametric yield loss is the yield loss due to the fraction of manufactured semiconductor chips that do not meet performance specifications among the chips that do not suffer from random defect yield loss or process limited yield loss. In other words, the chips affected by the parametric yield loss do not have random defects or out-of-specification process parameters that result in a hard failure, such as a short or an open. If an out of spec process parameter does not result in a hard failure, such as a short or an open, but does contribute to a deviation from modeled simulated behavior, and this deviation contributes to the chip not meeting the performance specification, then the chip is said to suffer from parametric or circuit limited yield. Additionally, at least one of design specification for the chip, which may be, for example, circuit timing or power consumption in on-state or in off-state, is out of specification. The cause of the failure of the chip to meet the design specification may not be attributed to the random defect yield loss or process limited yield loss, but is attributed to statistical distribution of performance of individual semiconductor devices in the semiconductor chip. The fraction of the number of chips that do not meet the device specification due to these reasons relative to the number of chips that are not affected by random defect yield loss or process limited yield loss is the parametric yield loss, which is sometimes also referred to as "circuit limited yield loss." Thus parametric yield loss has both a random, statistical component and a systematic component.

The impact of parametric yield loss increases in each succeeding technology node since more devices are integrated into a semiconductor chip. Recognizing the severe impact of the parametric yield loss, "design for manufacturability" (DFM) has been promoted as a concept. In essence, designers factor in potential yield impact of a particular design. While being a useful concept, design for manufacturability does not provide algorithms or methodology for systematically increasing parametric yield. Instead, it is a general recommendation to avoid designing circuits that may potentially cause performance problems.

It should be recognized, however, that employing an aggressive design that may potentially cause parametric yield issues is necessary to design a high performance chip. The difficult part is to estimate the balance between a potential gain in performance of an aggressive design and increase in parametric yield, i.e., decrease in parametric yield loss, of a conservative design.

Referring to FIG. 2, an exemplary prior art method for designing a semiconductor chip is shown in a flow chart 200. Referring to step 210, functional requirements of a chip are defined. The chip may be a processor, a volatile or non-volatile memory chip, or a system-on-chip (SoC) having multiple embedded components. Functional requirements include the nature of the chip as well as performance goals of the chip.

Referring to step 220, an electronic system level (ESL) description is generated based on the functional requirements of the chip. Electronic system level description and verification is a design methodology that focuses on the higher abstraction level without regard to lower level implementation. The goal of the ESL description is to enhance the probability of a successful implementation of functionality. Appropriate abstractions are utilized to generate a global level understanding of the chip to be designed. To this end, a high level programming language such as C or C++ is employed as an abstract modeling language to model the behavior of the entire system to be contained in a chip. Typically, this process is manual, although automation of this step by electronic design automaton (EDA) has been under investigation.

Referring to step 230, a register transfer level (RTL) description is generated from the electronic system level (ESL) description in the next chip design phase. Register transfer level (RTL) description is a description of a semiconductor chip design in terms of its operation. Specifically, the behavior of a circuit is defined in terms of data transfer, or flow of signals between hardware registers in the RTL description. Logical operations are performed on the data. A hardware description language (HDL) such as Verilog™ or VHDL™ is employed to create high-level representations of a circuit, from which lower level representations and ultimately actual discrete devices and wiring may be derived.

Referring to step 240, logic synthesis is performed to convert the RTL description in the form of the hardware description language (HDL) into a gate level description of the chip by a logic synthesis tool. Specifically, the gate level description is a discrete netlist of logic gate primitives, or "Boolean logic primitives."

Referring to step 250, placement and routing tools utilize the results of the logic synthesis to create a physical layout for the chip. Logic gates and other device components of the netlist are placed in a "layout," or a chip design. The chip design is then routed, i.e., wires are added to the placed components to provide interconnection between the components' signal and power terminals. Typically, this process is performed with tools employing electronic design automation (EDA) features.

Referring to step 260, power analysis and timing analysis is performed. It is noted that the exemplary prior art method scales power generation by scaling of a nominal device or multiple nominal devices. In other words, only the device type and device size are employed in the power analysis. The power analysis and the timing analysis are performed to check the chip design for functionality.

Referring to step 270, the chip design is analyzed to extract design specification. For example, timing analysis may be employed at this point to specify timing delay and expected chip operating frequency. Further, nominal leakage currents are estimated to specify power consumption of the chip.

Referring to FIG. 3, an exemplary prior art semiconductor chip manufacturing sequence including the steps of chip design is shown in a flow chart 300. Referring to step 310, a semiconductor chip design is provided as described in steps 210-260 of the flow chart 200 in FIG. 2. Referring to step 312, design specification is generated for the chip as in step 270 of the flow chart 200 in FIG. 2.

Referring to step 320, data preparation is performed on the chip design to generate various mask levels, which may then be transmitted to a "mask house," or a mask fabrication facility to initiate fabrication of physical masks to be employed in manufacturing of semiconductor chips. Various "design comps," or compensations to instances in design levels may be performed as part of data preparation. The mask house manufactures physical masks that may be subsequently employed in lithographic tools according to the mask level designs.

Referring to step 330, semiconductor chips are manufactured in a semiconductor chip fabrication facility. Typically, the semiconductor chips are manufactured on a semiconductor substrate such as a silicon substrate. Various semiconductor processing steps including lithography, deposition, and etching are employed.

Referring to step 340, the manufactured semiconductor chips are tested and characterized for functionality. Dysfunctional chips are sorted out. Operating frequency, on-state leakage, and off-state leakage are measured on functional chips.

Referring to step 350, parametric yield, i.e., circuit limited yield (CLY), is calculated for the group of semiconductor chips that do not suffer from random defect yield loss or process limited yield loss. Assuming a normal scenario in which the random defect yield loss and the process limited yield loss of the manufacturing process are within expected ranges, delivery of sufficient number of chips to a customer depends on the parametric yield loss. If the parametric yield exceeds a minimum parametric yield target value, sufficient number of chips meeting the design specification may be shipped to a customer, as shown in the step 360. If the parametric yield is below a minimum target value, not enough chips meeting the design specification are available for shipping, as shown in step 379.

In this case, few courses of systematic action are available to the semiconductor chip manufacturing facility for investigation of the source of the depressed parametric yield. While some methods are known in the art for diagnosing depressed process limited yield such as sorting the semiconductor chips by processing history or process variations, depressed parametric yield is much more difficult to investigate since the depressed parametric yield is correlated to specific design features of the semiconductor chip.

In financial perspective, when a semiconductor chip manufacturing facility commits to manufacture semiconductor chips based on an unknown chip design, the level of parametric yield loss is unpredictable from the perspective of the semiconductor chip manufacturing facility, while a customer generating a new chip design may have a vague idea of the level of expected parametric yield. Neither party has a good understanding on what level of parametric yield should be expected on the new chip design. Thus, lack of precise estimation of the parametric yield on the new chip design exposes a semiconductor chip manufacturing facility to a financial uncertainty, while the customer submitting the new design is not provided with any guidance on how to improve the design to enhance the parametric yield.

In view of the above, there exists a need for a system and methods for analyzing and managing parametric yield on a semiconductor chip during a chip design phase.

Further, there exists a need for a system and methods for analyzing and managing parametric yield on a semiconductor chip during a chip manufacturing phase or after a depressed parametric yield is observed in testing.

Yet further, there exists a need for a system and methods for predicting parametric yield at various levels to compare with observed data so that any anomaly in design may be found during testing of manufactured semiconductor chips.

SUMMARY OF THE INVENTION

The present invention addresses the needs described above by providing a system and methods for analyzing and managing parametric yield on a semiconductor chip during a chip design phase, a chip manufacturing phase, and after a depressed parametric yield is observed as well as a system and methods for comparing observed parametric yield with a parametric yield model.

In the present invention, impact on parametric performance of physical design choices for transistors is scored for on-current and off-current of the transistors. Design parameters affecting the on-current and off-current of the transistors include dimensions of various features of the transistor relative to nearby structures as well as across-chip-length-variation (ACLV) and corner rounding stress effects. The impact of the design parameters are incorporated into parameters that measure predicted shift in mean on-current and mean off-current and parameters that measure predicted increase in deviations in the distribution of the on-current and the off-current. Statistics may be taken at a cell level, a block level, or a chip level to optimize a chip design in a design phase, or to predict changes in parametric yield during manufacturing or after a depressed parametric yield is observed. Further, parametric yield and current level may be predicted region by region and compared with observed thermal emission to pinpoint any anomaly region in a chip to facilitate detection and correction in any mistakes in chip design.

According to an aspect of present invention, a system for designing a semiconductor chip is provided, which comprises:

threshold voltage adder calculation means for calculating a calculated threshold voltage adder for a device within a subset of a semiconductor chip design including an effect of at least one design parameter of the subset other than inherent geometric dimensions and inherent characteristics of the device; and parametric yield estimation means for estimating a parametric yield estimation value of the subset of the semiconductor chip design, wherein the parametric yield estimation value is based on the calculated threshold voltage adder.

In one embodiment, the system further comprises at least one of:

average on-current adder calculation means for calculating an average on-current adder for the subset of the semiconductor chip design; and average off-current adder calculation means calculating an average off-current adder for the subset of the semiconductor chip design, wherein the average on-current adder is an average deviation of on-current of the subset from a scaling-estimated on-current, which is obtained by scaling of at least one nominal device, due to the design parameters of the subset other than inherent geometric dimensions and inherent characteristics of at least one device of the subset, and wherein the average off-current adder is an average deviation of off-current of the subset from a scaling-estimated off-current, which is obtained by scaling of at least one nominal device, due to the design parameters of the subset other than inherent geometric dimensions and inherent characteristics of at least one device of the subset, and wherein the parametric yield estimation value is based on at least one of the average on-current adder and the average off-current adder.

In another embodiment, the subset comprises a cell containing one functional semiconductor device unit within the semiconductor chip design a plurality of semiconductor device units within the semiconductor chip design.

In even another embodiment, the design parameters of the subset comprises at least one of positional relationship between an element of the subset and another element of the subset and positional relationship between an element of the subset and another element of another subset in the semiconductor chip design.

In yet another embodiment, the system further comprises:

logic synthesis means for performing logic synthesis to generate a netlist of the semiconductor chip design, wherein the semiconductor design is the netlist; and flow control means for controlling flow of a sequence of operating the system, wherein the flow control means directs the flow to a step in which the netlist is modified if the parametric yield estimation value does not exceeds a target value.

In still another embodiment, the system further comprises:

placement and routing means for placing and routing a netlist of the semiconductor chip design to generate a chip layout, wherein the semiconductor design is the chip layout; and flow control means for controlling flow of a sequence of operating the system, wherein the flow control means directs the flow to a step in which the chip layout is modified if the parametric yield estimation value does not exceeds a target value.

In still yet another embodiment, the system further comprises at least one of:

incremental on-current deviation calculation means for calculating an incremental on-current deviation for the subset of the semiconductor chip design, wherein the incremental on-current deviation is an increment in statistical deviation of on-current of the subset of the semiconductor chip design from a scaling-estimated statistical deviation of on-current, which is obtained by scaling of statistical deviation of on-current of at least one nominal device, due to the design parameters of the subset other than inherent geometric dimensions and inherent characteristics of at least one device of the subset; and incremental off-current deviation calculation means for calculating an incremental off-current deviation for the subset of the semiconductor chip design, wherein the incremental off-current deviation is an increment in statistical deviation of off-current of the subset of the semiconductor chip design from a scaling-estimated statistical deviation of off-current, which is obtained by scaling of statistical deviation of off-current of at least one nominal device, due to the design parameters of the subset other than inherent geometric dimensions and inherent characteristics of devices in the subset.

In a further embodiment, the system further comprises at least one of:

on-current distribution calculation means for calculating statistical distribution of on-current within the subset; and off-current distribution calculation means for calculating statistical distribution of off-current within the subset.

In an even further embodiment, the system further comprises at least one of:

on-state temperature distribution calculation means for calculating on-state temperature distribution of a semiconductor chip manufactured with the semiconductor design; and off-state temperature distribution calculation means for calculating off-state temperature distribution of the semiconductor chip manufactured with the semiconductor design.

In a yet further embodiment, the on-state temperature distribution is calculated based on the statistical distribution of the on-current within the subset, and wherein the off-state temperature distribution is calculated based on the statistical distribution of the off-current within the subset.

In another aspect of the present invention, a system for analyzing parametric yield of a semiconductor chip design is provided, which comprises:

threshold voltage adder calculation means for calculating a calculated threshold voltage adder for a device within a subset of a semiconductor chip design including an effect of at least one design parameter of the subset other than inherent geometric dimensions and inherent characteristics of the device;

parametric yield estimation means for estimating a parametric yield estimation value of the subset of the semiconductor chip design, wherein the parametric yield estimation value is based on the calculated threshold voltage adder;

a tester for generating at least one measured parametric yield value by testing at least one semiconductor chip that is manufactured according to the semiconductor chip design; and parametric yield comparison means for comparing the parametric yield estimation value and the at least one measured parametric yield value.

In one embodiment, the design parameters of the subset comprises at least one of positional relationship of an element of the subset to another element of the subset and positional relationship of an element of the subset to another subset in the semiconductor chip design.

In another embodiment, the system further comprises at least one of:

incremental on-current deviation calculation means for calculating an incremental on-current deviation for the subset of the semiconductor chip design, wherein the incremental on-current deviation is an increment in statistical deviation of on-current of the subset of the semiconductor chip design from a scaling-estimated statistical deviation of on-current, which is obtained by scaling of statistical deviation of on-current of at least one nominal device, due to the design parameters of the subset other than inherent geometric dimensions and inherent characteristics of at least one device of the subset; and incremental off-current deviation calculation means for calculating an incremental off-current deviation for the subset of the semiconductor chip design, wherein the incremental off-current deviation is an increment in statistical deviation of off-current of the subset of the semiconductor chip design from a scaling-estimated statistical deviation of off-current, which is obtained by scaling of statistical deviation of off-current of at least one nominal device, due to the design parameters of the subset other than inherent geometric dimensions and inherent characteristics of devices in the subset.

In even another embodiment, the system comprises at least one of:

on-current distribution calculation means for calculating statistical distribution of on-current within the subset; and off-current distribution calculation means for calculating statistical distribution of off-current within the subset.

In yet another embodiment, the system further comprises:

a measured process parameter database that stores measured process parameter values that are measured during manufacturing of the at least one semiconductor chip;

a process model for correlating variations in the measured process parameter values with the at least one measured parametric yield value; and process model fitting means for fitting discrepancy between the parametric yield estimation value and the at least one measured parametric yield value with the measured process parameter values to improve accuracy of the process model.

In still another embodiment, the system further comprises parametric estimation value change simulation means for simulating a change in the parametric estimation value in response to changes in the design parameter.

According to yet another aspect of the present invention, a system for identifying a location of anomalous functionality on a semiconductor chip is provided, which comprises:

at least one of on-current distribution calculation means for calculating spatial distribution of on-current within the semiconductor chip and off-current distribution calculation means for calculating spatial distribution of off-current within the semiconductor chip;

current-to-temperature conversion means for converting one of the spatial distribution of on-current and the spatial distribution of the off-current into an estimated spatial temperature distribution map; and temperature distribution measurement means for generating a measured temperature distribution map of the semiconductor chip in an on-state or an off-state.

In one embodiment, the system comprises threshold voltage adder calculation means for calculating a calculated threshold voltage adder for a device within a subset of a semiconductor chip design including an effect of at least one design parameter of the subset other than inherent geometric dimensions and inherent characteristics of the device, wherein at least one of the spatial distribution of on-current and the spatial distribution of off-current is based on the calculated threshold voltage adder.

In another embodiment, the system further comprises:

a measured process parameter database that stores measured process parameter values that are measured during manufacturing of the semiconductor chip;

a process model for correlating the measured process parameter values with the measured temperature distribution map; and process model fitting means for fitting discrepancy between the measured temperature distribution map and at least one of the spatial distribution of on-current and the spatial distribution of off-current to improve accuracy of the process model.

In yet another embodiment, the system further comprises temperature distribution comparison means for comparing the estimated spatial temperature distribution map with the measured temperature distribution map of the semiconductor chip.

According to even another aspect of the present invention, a method of designing a semiconductor chip is provided, which comprises:

calculating a calculated threshold voltage adder for a device within a subset of a semiconductor chip design including an effect of at least one design parameter of the subset other than inherent geometric dimensions and inherent characteristics of the device; and estimating a parametric yield estimation value of the subset of the semiconductor chip design, wherein the parametric yield estimation value is based on the calculated threshold voltage adder.

In one embodiment, the method comprises at least one of:

calculating an average on-current adder for the subset of the semiconductor chip design; and calculating an average off-current adder for the subset of the semiconductor chip design, wherein the average on-current adder is an average deviation of on-current of the subset from a scaling-estimated on-current, which is obtained by scaling of at least one nominal device, due to the design parameters of the subset other than inherent geometric dimensions and inherent characteristics of at least one device of the subset, and wherein the average off-current adder is an average deviation of off-current of the subset from a scaling-estimated off-current, which is obtained by scaling of at least one nominal device, due to the design parameters of the subset other than inherent geometric dimensions and inherent characteristics of at least one device of the subset, and wherein the parametric yield estimation value is based on at least one of the average on-current adder and the average off-current adder.

In another embodiment, the method further comprises:

performing logic synthesis to generate a netlist of the semiconductor chip design, wherein the semiconductor design is the netlist; and controlling flow of a sequence of operating the system, wherein the flow control means directs the flow to a step in which the netlist is modified if the parametric yield estimation value does not exceeds a target value.

In even another embodiment, the method further comprises:

placing and routing a netlist of the semiconductor chip design to generate a chip layout, wherein the semiconductor design is the chip layout; and controlling flow of a sequence of operating the system, wherein the flow control means directs the flow to a step in which the chip layout is modified if the parametric yield estimation value does not exceeds a target value.

In yet another embodiment, the method further comprises at least one of:

calculating an incremental on-current deviation for the subset of the semiconductor chip design, wherein the incremental on-current deviation is an increment in statistical deviation of on-current of the subset of the semiconductor chip design from a scaling-estimated statistical deviation of on-current, which is obtained by scaling of statistical deviation of on-current of at least one nominal device, due to the design parameters of the subset other than inherent geometric dimensions and inherent characteristics of at least one device of the subset; and calculating an incremental off-current deviation for the subset of the semiconductor chip design, wherein the incremental off-current deviation is an increment in statistical deviation of off-current of the subset of the semiconductor chip design from a scaling-estimated statistical deviation of off-current, which is obtained by scaling of statistical deviation of off-current of at least one nominal device, due to the design parameters of the subset other than inherent geometric dimensions and inherent characteristics of devices in the subset.

In still another embodiment, the method further comprises at least one of:

calculating statistical distribution of on-current within the subset; and calculating statistical distribution of off-current within the subset.

In still yet another embodiment, the method further comprises at least one of:

calculating on-state temperature distribution of a semiconductor chip manufactured with the semiconductor design; and calculating off-state temperature distribution of the semiconductor chip manufactured with the semiconductor design.

According to still another aspect of the present invention, a method of analyzing parametric yield of a semiconductor chip design is provided, which comprises:

calculating a calculated threshold voltage adder for a device within a subset of a semiconductor chip design including an effect of at least one design parameter of the subset other than inherent geometric dimensions and inherent characteristics of the device;

estimating a parametric yield estimation value of the subset of the semiconductor chip design, wherein the parametric yield estimation value is based on the calculated threshold voltage adder;

generating at least one measured parametric yield value by testing at least one semiconductor chip that is manufactured according to the semiconductor chip design; and comparing the parametric yield estimation value and the at least one measured parametric yield value.

In one embodiment, the method further comprises at least one of:

calculating an incremental on-current deviation for the subset of the semiconductor chip design, wherein the incremental on-current deviation is an increment in statistical deviation of on-current of the subset of the semiconductor chip design from a scaling-estimated statistical deviation of on-current, which is obtained by scaling of statistical deviation of on-current of at least one nominal device, due to the design parameters of the subset other than inherent geometric dimensions and inherent characteristics of at least one device of the subset; and calculating an incremental off-current deviation for the subset of the semiconductor chip design, wherein the incremental off-current deviation is an increment in statistical deviation of off-current of the subset of the semiconductor chip design from a scaling-estimated statistical deviation of off-current, which is obtained by scaling of statistical deviation of off-current of at least one nominal device, due to the design parameters of the subset other than inherent geometric dimensions and inherent characteristics of devices in the subset.

In another embodiment, the method further comprises at least one of:

calculating statistical distribution of on-current within the subset; and calculating statistical distribution of off-current within the subset.

In even another embodiment, the method further comprises:

storing measured process parameter values that are measured during manufacturing of the at least one semiconductor chip;

correlating variations in the measured process parameter values with the at least one measured parametric yield value with a process model; and fitting discrepancy between the parametric yield estimation value and the at least one measured parametric yield value with the measured process parameter values to improve accuracy of the process model.

In yet another embodiment, the method further comprises simulating a change in the parametric estimation value in response to changes in the design parameter.

According to still yet another aspect of the present invention, a method of identifying a location of anomalous functionality on a semiconductor chip is provided, which comprises:

calculating at least one of spatial distribution of on-current within the semiconductor chip and spatial distribution of off-current within the semiconductor chip;

converting one of the spatial distribution of on-current and the spatial distribution of the off-current into an estimated spatial temperature distribution map; and generating a measured temperature distribution map of the semiconductor chip in an on-state or an off-state.

In one embodiment, the method further comprises calculating a calculated threshold voltage adder for a device within a subset of a semiconductor chip design including an effect of at least one design parameter of the subset other than inherent geometric dimensions and inherent characteristics of the device, wherein at least one of the spatial distribution of on-current and the spatial distribution of off-current is based on the calculated threshold voltage adder.

In another embodiment, the method further comprises:

storing measured process parameter values that are measured during manufacturing of the semiconductor chip;

correlating the measured process parameter values with the measured temperature distribution with a process model; and fitting discrepancy between the measured temperature distribution map and at least one of the spatial distribution of on-current and the spatial distribution of off-current to improve accuracy of the process model.

In yet another embodiment, the method further comprises comparing the estimated spatial temperature distribution map with the measured temperature distribution map of the semiconductor chip, wherein a location of discrepancy is identified as the location of anomalous functionality.

DETAILED DESCRIPTION OF THE INVENTION

Figure 1:
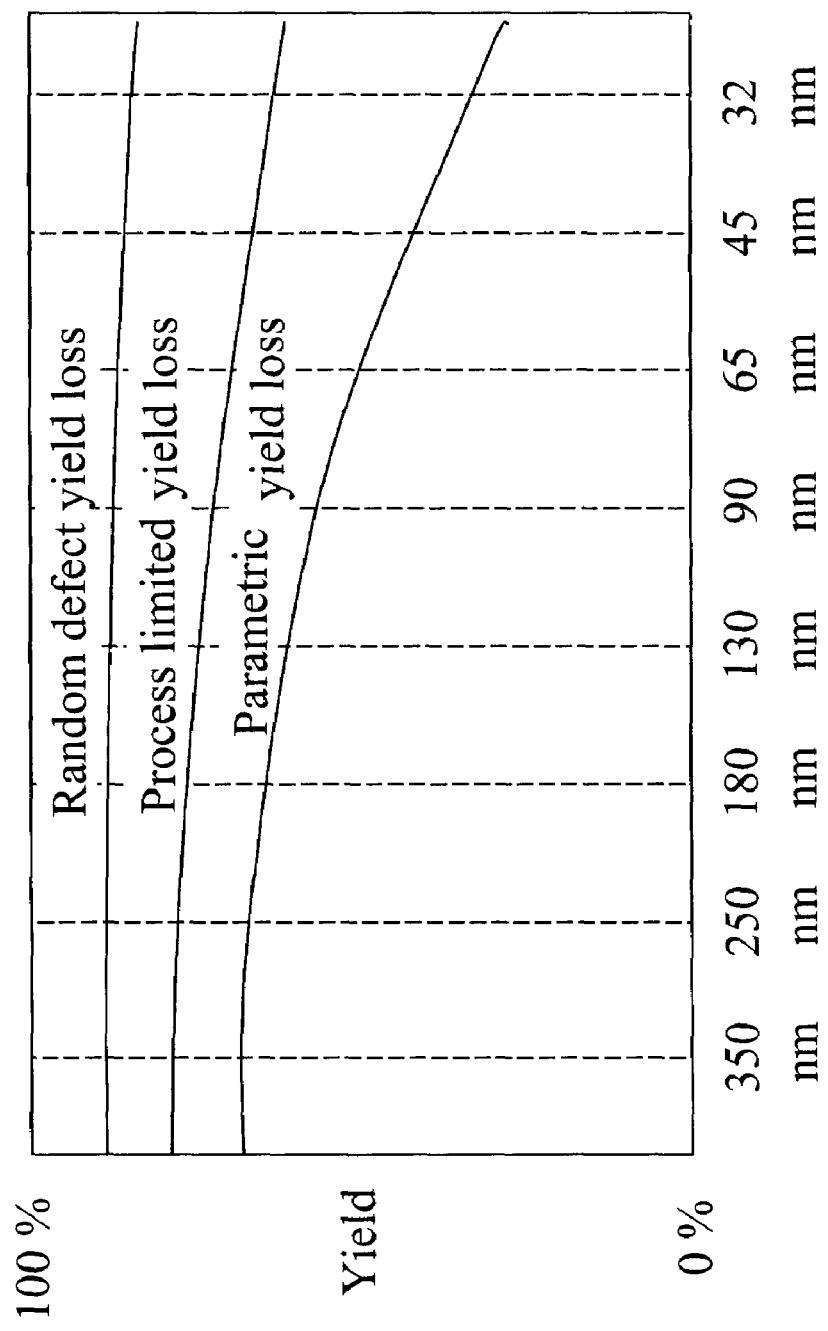
FIG. 1 is a graph showing trends of various yield loss components at successive semiconductor technology nodes.

As stated above, the present invention relates to methods and systems for analyzing and improving parametric yield in semiconductor device manufacturing, which are now described in detail with accompanying figures. It is noted that like and corresponding elements mentioned herein and illustrated in the drawings are referred to by like reference numerals.

In a transistor, the distance between source and drain regions of the transistor and an edge of a well containing the source and drain regions affects the threshold voltage of the transistor. Such effects are known in the art as well proximity effects. U.S. Pat. No. 7,089,513 to Bard et al. describes well proximity effects and is herein incorporated by reference.

Due to well proximity effects, threshold voltages of the p-type field effect transistors of the same category that differ only by the size, i.e., the width of the gate that is the dimension of an active area abutting a gate dielectric along the direction perpendicular to the direction of current flow, are affected not only by the size of the p-type field effect transistors but also by the proximity of the edge of the active area to a nearby n-type well.

In general, the threshold voltage of a transistor depends not only on inherent geometric dimensions and inherent characteristics and composition of components of the transistor but also on design parameters of a subset of a semiconductor chip including the transistor. The design parameters contain at least one element that is external to the transistor. As an example, the well proximity effect involves design parameters of a subset of a semiconductor chip, in which the subset includes the transistor and the well containing the transistor. The location of the edge of the well is not a component of the transistor. Therefore, the edge of the well is external to the transistor. However, a design parameter, which in this case is the distance between the source and drain regions and the edge of the well, affects the threshold voltage of the transistor. Therefore, a design parameter that of the subset of the semiconductor chip other than inherent geometric dimensions and inherent characteristics of the transistor affects characteristics of the transistor, and specifically, affects the threshold voltage of the transistor.

Figure 4:
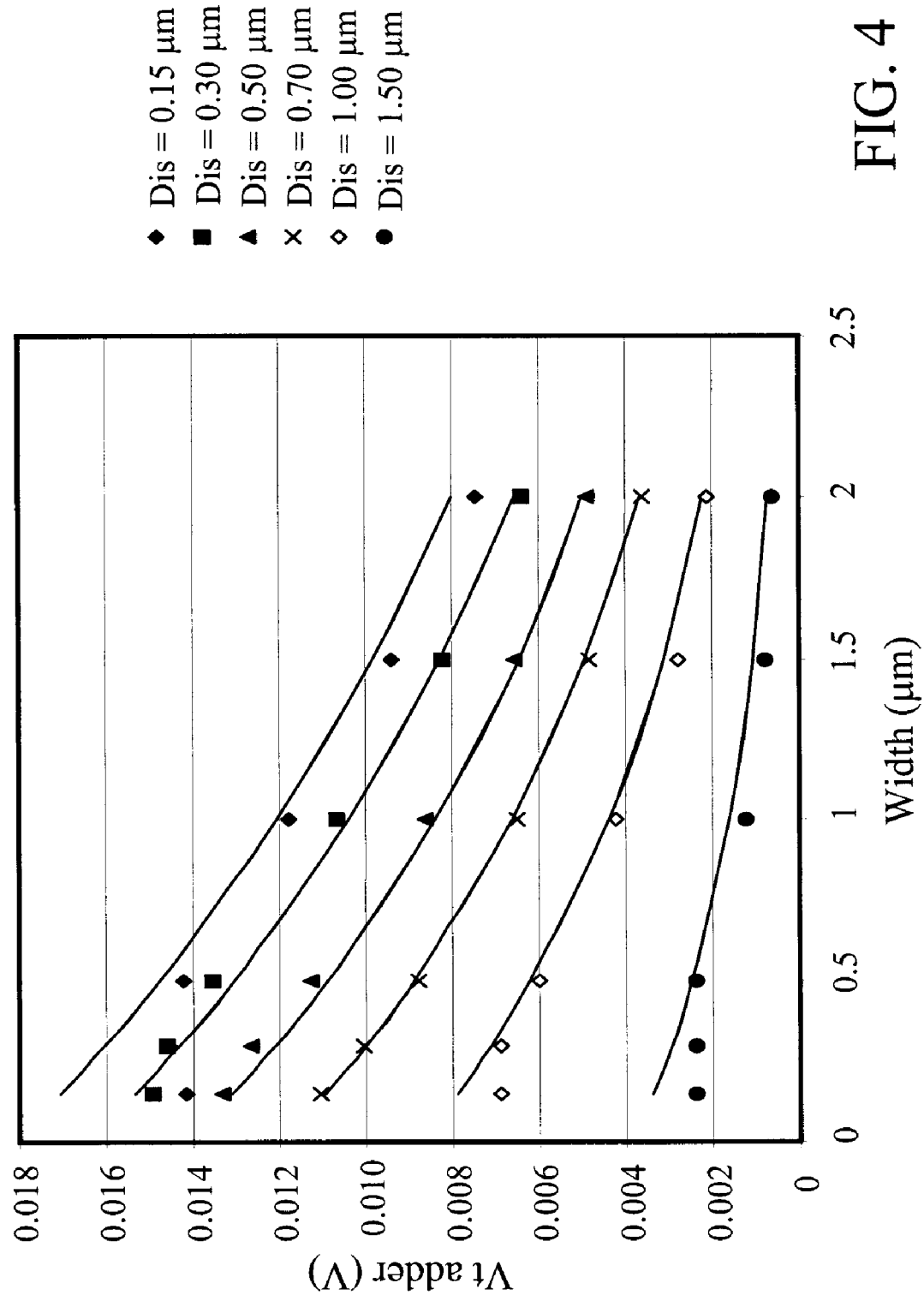
FIG. 4 is a graph showing an exemplary method calculating a threshold voltage (Vt) adder based on proximity of a transistor to an adjacent well as well as a width of the transistor according to the present invention.

Referring to FIGS. 4, a graph showing variations in threshold voltage (Vt) adder values for p-type field effect transistors due to proximity to an n-well edge as well as the size of the p-type field effect transistors. The threshold voltage (Vt) adder is an average deviation of the threshold voltage of a transistor from a nominal transistor. A nominal transistor is an idealized transistor representing a class of transistors having a similar feature. For example, a nominal transistor may have a fixed gate length and a fixed gate width and may be embedded in a semiconductor chip in a specified environment. The specified environment may be a nested environment, which is an environment in which a plurality of nominal transistor are arranged in a one-dimensional or a two-dimensional array, or may be an isolated environment, which is an environment in which the nominal device is isolated by surrounding electrical isolation structures.

Due to statistical nature of semiconductor processing steps, and especially due to stochastic nature of ion implantation processing steps, the threshold voltage of a nominal transistor has a statistical distribution. A nominal threshold voltage of a nominal device refers to a statistical average of a threshold voltage distribution measured on an ensemble of nominal devices. Threshold voltage distribution inherently has a non-zero deviation for the threshold voltage for the nominal devices. In case the threshold voltage distribution has a form of a Gaussian distribution, a standard deviation may be defined. Since actual threshold voltage distributions are typically Gaussian, presence of a standard deviation in the threshold voltage distributions is herein assumed.

Of the two variables used in this graph, the first variable is a gate width, which is the width of the overlap of the gate of the transistor with the active area of the transistor that is measured in the direction perpendicular to the current flow between the source and the drain. The gate width is a variable derived from inherent geometric dimensions and inherent characteristics of the p-type field effect transistors. The second variable is well edge proximity, which is the distance between the source and drain regions of the p-type transistor to a nearest edge of the n-well that contains the p-type filed effect transistor is a variable that is external to the p-type field effect transistors. Thus, the well edge proximity may not be derived from inherent geometric dimensions and inherent characteristics of a p-type field effect transistor alone. Extraction of the second parameter requires data from a subset of a semiconductor chip design such that the subset contains a component, which in this case is an n-well, other than the p-type field effect transistor. Thus, access to, and consideration of, design parameters of a subset of a semiconductor chip design enables calculation of expected shift in transistor characteristics including any deviation in the threshold voltage due to the design parameters internal and external to the transistor.

For a given width of the gate and a given value for well edge proximity, a distribution of values is observed in measured threshold voltage of a transistor. The difference between measured threshold voltage of a transistor having inherent geometric dimensions and inherent characteristics and design parameters of a subset of a semiconductor chip design external to the transistor and the nominal threshold voltage of a nominal transistor is the threshold voltage (Vt) adder. The design parameters that may not be directly obtained from the design of the transistor alone are herein referred to as external design parameters of the transistor. The design parameters that may be obtained from the design of the transistor alone are herein referred to as inherent design parameters of the transistor. Due to the statistical nature of the effect of the inherent and external design parameters and threshold voltage distribution of nominal devices, the threshold voltage adder has a distribution of for each set of design parameters.

Statistical quantities may be defined for the threshold voltage adder for each set of design parameters.

In the case of FIG. 4, solid curves represent a fit for nominal threshold voltage adder values for the p-type field effect transistor for the specified design parameters, i.e., the gate width and the well edge proximity. Nominal threshold voltage adder is an average shift in the threshold voltage from the nominal threshold voltage due to the inherent and external design parameters. The nominal threshold voltage adder may be positive or negative. Other statistical quantities such as deviation of threshold voltage adder and various percentile values, e.g., 1 percentile values, 5 percentile values, 95 percentile values, 99 percentile values, as well as maximum and minimum observed values for a given number of samples may be measured and mathematically fitted. The deviation of threshold voltage adder is the deviation of the distribution of the threshold voltage adder, which is the distribution of the shift in the threshold voltage from the nominal threshold voltage.

In general, the effect of inherent design parameters and external design parameters is modeled by building a macro, or a test structure, that measures the effect of the inherent design parameters and external design parameters on manufactured semiconductor test chips. Methods of measuring the effect of inherent design parameters such as gate length and gate width are known in the art. According to the present invention, the effect of external design parameters are also measured and incorporated into a compact model, which is a model for predicting performance of a semiconductor device such as a transistor.

The external design parameters may include positional relationship of an element of a subset of a semiconductor chip design that contains a device to be characterized and another element of the subset of the semiconductor chip design. One of the two elements may, or may not, be a component of the device. For example, the device may be a transistor, the subset may comprise the transistor and a well in which the transistor is placed, the element may be source and drain regions, and the other element may be an edge of the well. In this case, one of the two elements is a component of the transistor.

Alternately, the external design parameters may include positional relationship of an element of a subset of a semiconductor chip design that does not contain a device to be characterized and another element of the subset of the semiconductor chip design that does not contain the device. For example, the device may be a transistor, the subset may comprise the device and two stress-generating structure located adjacent to the device, and each of the two elements may be one of the two stress-generating structures. In this case, none of the two elements comprises a component of the transistor.

Yet alternately, the external design parameters may include positional relationship of a first element of a first subset of a semiconductor chip design that contains a device to be characterized and a second element of a second subset of the semiconductor chip design. The first element may, or may not, be a component of the device. For example, the device may be a transistor, the first subset may comprise the transistor and a first well in which the transistor is placed, the first element may be source and drain regions, the second subset may comprise another well located adjacent to the first well, and the second element may be an edge of the second well. In this case, the first element is a component of the device. In another example, the device may be a transistor, the first subset may comprise the transistor and a first well in which the transistor is placed, the first element may be an edge of the first well, the second subset may comprise another well located adjacent to the first well, and the second element may be an edge of the second well. In this case, the first element is not a component of the device.

Non-limiting examples of external design parameters that may be employed to evaluate the effect on the threshold voltage adder include distance and orientation of well edges relative to an element of a transistor, distance and orientation of edges of stress-generating structures such as embedded stress-generating materials or stress-generating dielectric liners relative to an element of the transistor, and distance and orientation of elements of other semiconductor devices relative to the transistor and among themselves. Further, power density during an on-state or an off-state of the semiconductor chip within the subset of the semiconductor chip design may be employed to estimate the temperature of the portion of the semiconductor chip design to assess the impact of ambient temperature on the threshold voltage adder.

The effect of the inherent design parameters and external design parameters is then incorporated into threshold voltage adder calculation means such as a compact model. The compact model according to the present invention has the capability to calculate nominal threshold voltage adder and other statistical quantities such as deviation of threshold voltage adder in addition to other device characteristics prediction capabilities known in the art. The threshold voltage adder calculation means may alternately be a program dedicated to calculation of the threshold voltage adder values. The threshold voltage adder thus calculated is herein referred to as "calculated threshold voltage adder" to be differentiated from measured values of threshold voltage adder. It is noted that the calculated threshold voltage adder is not necessarily a scalar value for a functional semiconductor device, but preferably and generally, a distribution having an average value and associated statistical quantities such as deviations and quantiles.

A "mean calculated threshold voltage adder" is a mean of the calculated threshold voltage adder, which is a distribution. A "deviation of calculated threshold voltage adder" is a standard deviation of the calculated threshold voltage adder. Mathematically, $$\Delta Vt^{mean} = \sum_{i=1}^{n} \Delta Vt_i^{mean}, \text{ and} \qquad \text{(Equation 1)}$$

$$\sigma_{Vt}^2 - \sigma_{Vt\_0}^2 = \sum_{i=1}^{n} \Delta(\sigma_{Vt\_i}^2), \qquad \text{(Equation 2)}$$

wherein $\Delta Vt^{mean}$ is the mean calculated threshold voltage adder of a device, i.e., the transistor on which the calculated threshold voltage adder as a distribution is calculated, $\eta$ is the total number of the design parameters that are related to the threshold voltage adder of the transistor, and $\Delta Vt_i^{mean}$ is a contribution of the i-th design parameter within the subset to the mean calculated threshold voltage adder, and wherein $\sigma_{Vt}^2$ is the variance (which is the square of the standard deviation) of the threshold voltage of the transistor on which the calculated threshold voltage adder is calculated, $\sigma_{Vt\_0}^2$ is the variance of the threshold voltage of a nominal device, $\Delta(\sigma_{Vt\_i}^2)$ is a change in the variance of the threshold voltage of the nominal device that is scaled to the size of the transistor due to the i-th design parameter within the subset. Each of the $\Delta(\sigma_{Vt\_i}^2)$ may be positive or negative, i.e., the effect of the i-th design parameter may be to reduce or to increase the variance of the transistor on which the effect of the i-th design parameter is calculated. The design parameters include inherent and external design parameters of the transistor.

Further, the calculation of the calculated threshold voltage adder may be repeated to include all semiconductor devices within a subset of a semiconductor chip design that includes a functional semiconductor device. The subset of the semiconductor chip design includes at least one functional semiconductor device. In general, the subset of the semiconductor chip design may include only one functional semiconductor device, or a "cell," an array of functional semiconductor devices within the semiconductor chip design, a functional block containing a plurality of semiconductor devices of different types, or the entirety of the semiconductor chip.

The calculation of the calculated threshold voltage adder may be repeated for each subset of the semiconductor chip design to encompass the entirety of the semiconductor chip design.

Statistical data is extracted from the calculated threshold voltage adders for the subset of the semiconductor chip design. Depending on the nature of the subset of the semiconductor chip design, the statistical data on the calculated threshold voltage adders may be for each device type, for each region of the semiconductor chip design, for each functional block, and/or for the entirety of the semiconductor chip design.

Parametric yield estimation means is then employed to estimate a parametric yield estimation value for each subset of the semiconductor chip design. The estimation of the parametric yield estimation value may be based directly on the statistical data on the calculated threshold voltage adders for each subset of the semiconductor chip design. Alternately, intermediate quantities may be calculated from the data set on the calculated threshold voltage adders to generate a more sophisticated and accurate estimation of the parametric yield estimation value.

Parametric yield estimation means may be a computer program that compares overall threshold voltage distribution with a projected parametric yield value. The parametric yield estimation means includes a yield model that projects or estimates parametric yield of a subset of a semiconductor chip design based on statistical data extracted from the calculated threshold voltage adders or based on the data set of the calculated threshold voltage adders of the subset of the semiconductor chip design. The projected value, or the estimated value, of the parametric yield is the projected parametric yield value for the subset of the semiconductor chip design. Thus, the projected parametric yield value may be for each device type, for each region of the semiconductor chip design, for each functional block, and/or for the entirety of the semiconductor chip design.

In case the projected parametric yield value is calculated by employing the full data set of the calculated threshold voltage adders, current based performance deviation measurement quantities may be derived. Current based performance deviation measurement quantities may include an average on-current adder and/or an average off-current adder for the subset of the semiconductor chip design. An average on-current adder and/or an average off-current adder may be calculated for a subset of a semiconductor chip design. The average on-current adder and/or the average off-current adder may be positive or negative. The subset may comprise a device such as a transistor. In case the subset comprises a plurality of devices, calculation of an average on-current adder and/or an average off-current adder may be repeated for every device in the subset. The average on-current adder and/or the average off-current adder of the subset in this case is a mathematical average, which could be a mean, a median, or a mode, of the set of average on-current adders and/or the set of average off-current adders of the entirety of the subset of the semiconductor chip design.

Mathematically, $$\Delta I\_on^{ave} = \sum_{i=1}^{n} \Delta I\_on_i^{ave}, \text{ and} \quad \text{(Equation 3)}$$

$$\Delta I\_off^{ave} = \sum_{i=1}^{n} \Delta I\_off_i^{ave}, \quad \text{(Equation 4)}$$

wherein $\Delta I\_on^{ave}$ is the average on-current adder of a device, i.e., the transistor on which the on-current adder as a distribution is calculated, n is the total number of the design parameters that are related to the threshold voltage adder of the transistor, and $\Delta I\_on_i^{ave}$ is a contribution of the i-th design parameter within the subset to the average on-current adder, and wherein $\Delta I\_off^{ave}$ is the average off-current adder of the transistor, and $\Delta I\_off_i^{ave}$ is a contribution of the i-th design parameter within the subset to the average off-current adder. As noted above, the average may be a mean, a median, or a mode. The design parameters include inherent and external design parameters of the transistor.

Calculation of the average on-current adder for the subset and the average off-current adder for the subset employs average on-current adder calculation means and average off-current calculation means, respectively. On-current adder calculation means and/or off-current adder calculation means may be a stand-alone program that is dedicated to calculation of the average on-current adder and the average off-current adder, and may reside in a computer. Alternately, the on-current adder calculation means and/or the off-current adder calculation means may be integrated into a system, which may include other automated programs, for designing a semiconductor chip or for diagnosing parametric yield of semiconductor chips.

The average on-current adder is an average deviation of on-current of the subset from a scaling-estimated on-current, which is obtained by scaling of at least one nominal device, due to the design parameters of the subset other than inherent geometric dimensions and inherent characteristics of at least one device of the subset. The average off-current adder is an average deviation of off-current of the subset from a scaling-estimated off-current, which is obtained by scaling of at least one nominal device, due to the design parameters of the subset other than inherent geometric dimensions and inherent characteristics of at least one device of the subset.

The parametric yield estimation value is based on at least one of the average on-current adder of the subset and the average off-current adder of the subset. The average on-current adder may be calculated for each device type, for each region of the semiconductor chip design, for each functional block, and/or for the entirety of the semiconductor chip design. Likewise, the average off-current adder may be calculated for each device type, for each region of the semiconductor chip design, for each functional block, and/or for the entirety of the semiconductor chip design.

In addition, current based performance deviation measurement quantities may include an average on-current adder and/or an average off-current adder for the subset of the semiconductor chip design. An incremental on-current deviation and/or an incremental off-current deviation may be calculated for a device for a subset of a semiconductor chip design. The incremental on-current deviation and/or the incremental off-current deviation may be positive or negative.

The subset may comprise a device such as a transistor. In case the subset comprises a plurality of devices, calculation of an incremental on-current deviation and/or an incremental off-current deviation may be repeated for every device in the subset.

Mathematically, $$\Delta\sigma_{I\_on} = [\sigma_{I\_on}^2 - \sigma_{I\_on\_0}^2]^{1/2} \quad \text{(Equation 5a)}$$
$$= \left[\sum_{i=1}^{n} \Delta(\sigma_{I\_on\_i}^2)\right]^{1/2},$$
$$\text{if } \sigma_{I\_on}^2 - \sigma_{I\_on\_0}^2 > 0, \text{ or}$$

$$\Delta\sigma_{I\_on} = -|\sigma_{I\_on}^2 - \sigma_{I\_on\_0}^2|^{1/2} \quad \text{(Equation 5b)}$$
$$= -\left|\sum_{i=1}^{n} \Delta(\sigma_{I\_on\_i}^2)\right|^{1/2},$$
$$\text{if } \sigma_{I\_on}^2 - \sigma_{I\_on\_0}^2 < 0,$$

wherein $\Delta\sigma_{I\_on}$ is the incremental on-current deviation of a device, i.e., the transistor on which the on-current as a distribution is calculated, $\sigma_{I\_on}^2$ is the variance of the on-current of the transistor, n is the total number of the design parameters that are related to the threshold voltage adder of the transistor, $\sigma_{I\_on\_0}^2$ is a scaled variance of the on-current a nominal transistor that is scaled to match the size of the transistor on which the on-current distribution is calculated, and wherein $\Delta(\sigma_{I\_on\_i}^2)$ is a contribution of the i-th design parameter to the change of the variance of the on-current of the transistor. Since $\sigma_{I\_on}^2 - \sigma_{I\_on\_0}^2$ may be positive or negative, the change in the on-current deviation may be positive or negative. In other words, the incremental on-current deviation, which measures changes in the standard deviation due to the collective set of the design parameters of the transistor, may be an increment or decrement. The design parameters include inherent and external design parameters of the transistor.

Likewise, $$\Delta\sigma_{I\_off} = [\sigma_{I\_off}^2 - \sigma_{I\_off\_0}^2]^{1/2} \quad \text{(Equation 6a)}$$
$$= \left[\sum_{i=1}^{n} \Delta(\sigma_{I\_off\_i}^2)\right]^{1/2},$$
$$\text{if } \sigma_{I\_off}^2 - \sigma_{I\_off\_0}^2 > 0, \text{ or}$$

$$\Delta\sigma_{I\_off} = -|\sigma_{I\_off}^2 - \sigma_{I\_off\_0}^2|^{1/2} \quad \text{(Equation 6b)}$$
$$= -\left|\sum_{i=1}^{n} \Delta(\sigma_{I\_off\_i}^2)\right|^{1/2},$$
$$\text{if } \sigma_{I\_off}^2 - \sigma_{I\_off\_0}^2 < 0,$$

wherein $\Delta\sigma_{I\_off}$ is the incremental off-current deviation of a device, i.e., the transistor on which the on-current as a distribution is calculated, $\sigma_{I\_off}^2$ is the variance of the off-current of the transistor, n is the total number of the design parameters that are related to the threshold voltage adder of the transistor, $\sigma_{I\_off\_0}^2$ is a scaled variance of the off-current a nominal transistor that is scaled to match the size of the transistor on which the off-current distribution is calculated, and wherein $\Delta(\sigma_{I\_off\_i}^2)$ is a contribution of the i-th design parameter to the change of the variance of the off-current of the transistor. Since of $\sigma_{I\_off}^2 - \sigma_{I\_off\_0}^2$ may be positive or negative, the change in the off-current deviation may be positive or negative. In other words, the incremental off-current deviation, which measures changes in the standard deviation due to the collective set of the design parameters of the transistor, may be an increment or decrement. The design parameters include inherent and external design parameters of the transistor.

Calculation of the incremental on-current deviation for the subset and the incremental off-current deviation for the subset employs incremental on-current deviation calculation means and incremental off-current deviation calculation means, respectively. Incremental on-current deviation calculation means and/or incremental off-current deviation calculation means may be a stand-alone program that is dedicated to calculation of the incremental on-current deviation and the incremental off-current deviation, and may reside in a computer. Alternately, the incremental on-current deviation calculation means and/or the incremental off-current deviation calculation means may be integrated into a system, which may include other automated programs, for designing a semiconductor chip or for diagnosing parametric yield of semiconductor chips.

The incremental on-current deviation is an increment in statistical deviation of on-current of the subset of the semiconductor chip design from a scaling-estimated statistical deviation of on-current due to the design parameters of the subset other than inherent geometric dimensions and inherent characteristics of at least one device of the subset. The scaling-estimated statistical deviation of on-current is obtained by scaling of statistical deviation of on-current of at least one nominal device. The incremental off-current deviation is an increment in statistical deviation of off-current of the subset of the semiconductor chip design from a scaling-estimated statistical deviation of off-current due to the design parameters of the subset other than inherent geometric dimensions and inherent characteristics of devices in the subset. The scaling-estimated statistical deviation of off-current is also obtained by scaling of statistical deviation of off-current of at least one nominal device.

The parametric yield estimation value is based on at least one of the incremental on-current deviation of the subset and the incremental off-current deviation of the subset. The incremental on-current deviation may be calculated for each device type, for each region of the semiconductor chip design, for each functional block, and/or for the entirety of the semiconductor chip design. Likewise, the incremental off-current deviation may be calculated for each device type, for each region of the semiconductor chip design, for each functional block, and/or for the entirety of the semiconductor chip design.

Further, on-current distribution calculation means may be employed to combine a first data set for the average on-current adder of the subset and a second data set for the incremental on-current deviation of the subset, and to calculate statistical distribution of on-current within the subset. Likewise, off-current distribution calculation means may be employed to combine a third data set for the average off-current adder of the subset and a fourth data set for the incremental off-current deviation of the subset, and to calculate statistical distribution of on-current within the subset. Each of the statistical distribution of on-current within the subset and the statistical distribution of off-current of the subset contains data for at least two devices within the subset. Calculation of the statistical distribution of on-current and/or the statistical distribution of off-current of the subset may be performed device by device for each device in the subset, or alternatively, may be performed by grouping each of the first through fourth data set into sub-groups containing data for at least two devices within each.

The on-current distribution calculation means and/or the off-current distribution calculation means may be a stand-alone program that is dedicated to calculation of the statistical distribution of on-current within the subset and the statistical distribution of off-current within the subset, and may reside in a computer. Alternately, the on-current distribution calculation means and/or the off-current distribution calculation means may be integrated into a system, which may include other automated programs, for designing a semiconductor chip or for diagnosing parametric yield of semiconductor chips.

The statistical distribution of on-current is statistical distribution of on-current of the entirety of devices in the subset. The statistical distribution of off-current is statistical distribution of off-current of the entirety of devices in the subset. A plurality of subsets that collectively comprise the entirety of the semiconductor chip design may be employed to generate a first set of statistical distribution of on-current of subsets of the semiconductor chip design and a second set of statistical distribution of off-current of the subsets of the semiconductor chip design. The plurality of subsets may be selected such that each of the plurality of subsets is disjoined from one another and has a unit area and the plurality of subsets collectively constitute the entirety of the semiconductor chip design. In this case, the first set of statistical distribution of on-current of subsets of the semiconductor chip design is an areal on-current density and a second set of statistical distribution of off-current of the subsets of the semiconductor chip is an areal off-current density. Statistical quantities such as a mathematical average, deviations, various quantiles, maximum, and minimum may be derived from each of the statistical distribution of on-current of the subset and the statistical distribution of off-current of the subset.

In this case, the parametric yield estimation value is based on at least one of the statistical distribution of on-current of the subset and the statistical distribution of off-current of the subset. The statistical distribution of on-current of the subset may be calculated for each device type, for each region of the semiconductor chip design, for each functional block, and/or for the entirety of the semiconductor chip design. Likewise, the statistical distribution of off-current of the subset may be calculated for each device type, for each region of the semiconductor chip design, for each functional block, and/or for the entirety of the semiconductor chip design.

Yet further, on-state temperature distribution calculation means may be employed to calculate on-state temperature distribution of a semiconductor chip that is manufactured with the semiconductor chip design. Likewise, off-state temperature distribution calculation means may be employed to calculate off-state temperature distribution of a semiconductor chip that is manufactured with the semiconductor chip design. The calculated on-state temperature distribution may be directly based on the areal on-current density, which is the first set of statistical distribution of on-current of subsets of the semiconductor chip design described above. The calculated off-state temperature distribution may be directly based on the areal off-current density, which is the second set of statistical distribution of off-current of subsets of the semiconductor chip design described above. Alternately, the on-state temperature distribution of the semiconductor chip and/or the off-state temperature distribution of the semiconductor chip may be an ab initio calculation based on calculated threshold voltage adder, an average on-current adder, and/or an average off-current adder for each device in the semiconductor chip design.

The on-state temperature distribution calculation means and/or the off-state temperature distribution calculation means may be a stand-alone program that is dedicated to calculation of the on-state temperature distribution within the subset and the off-state temperature distribution within the subset, and may reside in a computer. Alternately, the on-state temperature distribution calculation means and/or the off-state temperature distribution calculation means may be integrated into a system, which may include other automated programs, for designing a semiconductor chip or for diagnosing parametric yield of semiconductor chips.

The calculation of the on-state temperature distribution of the semiconductor chip design and/or the on-state temperature distribution may be performed on a subset of a semiconductor chip design that is less than the entirety of the semiconductor chip design, or may be performed on the entirety of the subset of the semiconductor chip design, i.e., the subset is equal to the entirety of the semiconductor chip design. In case the calculation is performed on the entirety of the semiconductor chip design, a plurality of subsets that collectively comprise the entirety of the semiconductor chip design may be employed to calculate the on-state temperature distribution of the semiconductor chip design and/or the on-state temperature distribution of the semiconductor chip design. The plurality of subsets may be selected such that each of the plurality of subsets is disjoined from one another and has a unit area and the plurality of subsets collectively constitute the entirety of the semiconductor chip design. The on-state temperature distribution of the semiconductor chip design and the off-state temperature distribution of the semiconductor chip design may be nominal temperature distributions, i.e., average temperature distributions. In other words, the on-state temperature distribution is a statistical average of an ensemble of on-state temperature distributions. The statistical average may be a statistical mean, statistical median, or statistical mode.

Statistical variations in the on-state temperature distribution and/or in the off-state temperature distribution may also be generated by employing statistical quantities of the statistical distribution of on-current of the subsets and/or the statistical quantities of the statistical distribution of the off-current of the subsets. The statistical quantities may include deviations, various quantiles, maximum, and minimum of each of the statistical distributions. Statistical quantile temperature distributions may thus be generated from the statistical distribution of on-current of the subsets and/or the statistical quantities of the statistical distribution of the off-current of the subsets. For example, 0.1% quantile on-temperature distribution represents the on-temperature distribution that only 0.1% of an ensemble of measured temperature distribution generated from a randomly selected manufactured semiconductor chips is expected to exceed in temperature.

In this case, the parametric yield estimation value may be based on the statistical average of, and/or statistical variations in, the on-state temperature distribution and/or the off-state temperature distribution. The parametric yield estimation value may be calculated for each device type, for each region of the semiconductor chip design, for each functional block, and/or for the entirety of the semiconductor chip design.

Figure 2:
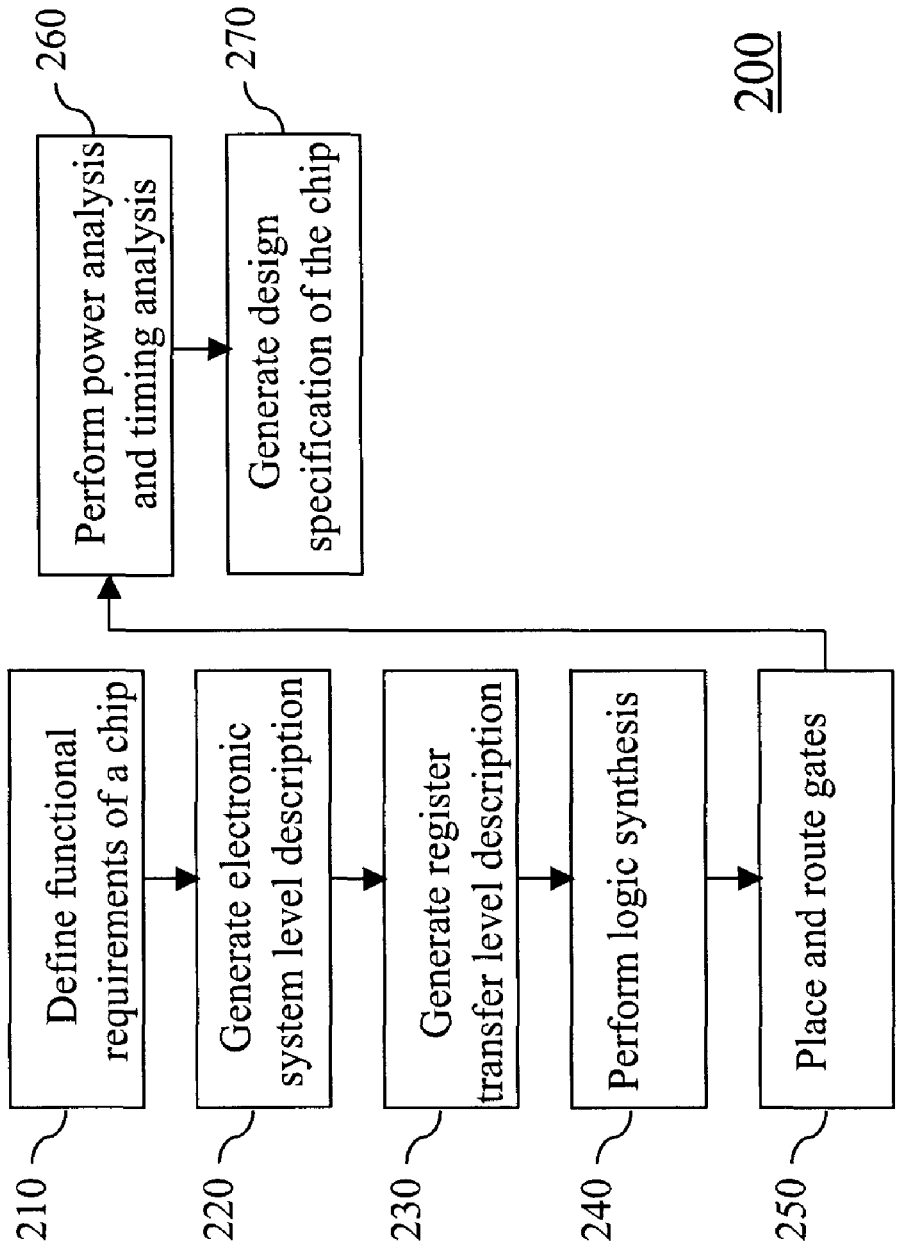
FIG. 2 is a flow chart for a prior art method for generating a semiconductor chip design.
Figure 5:
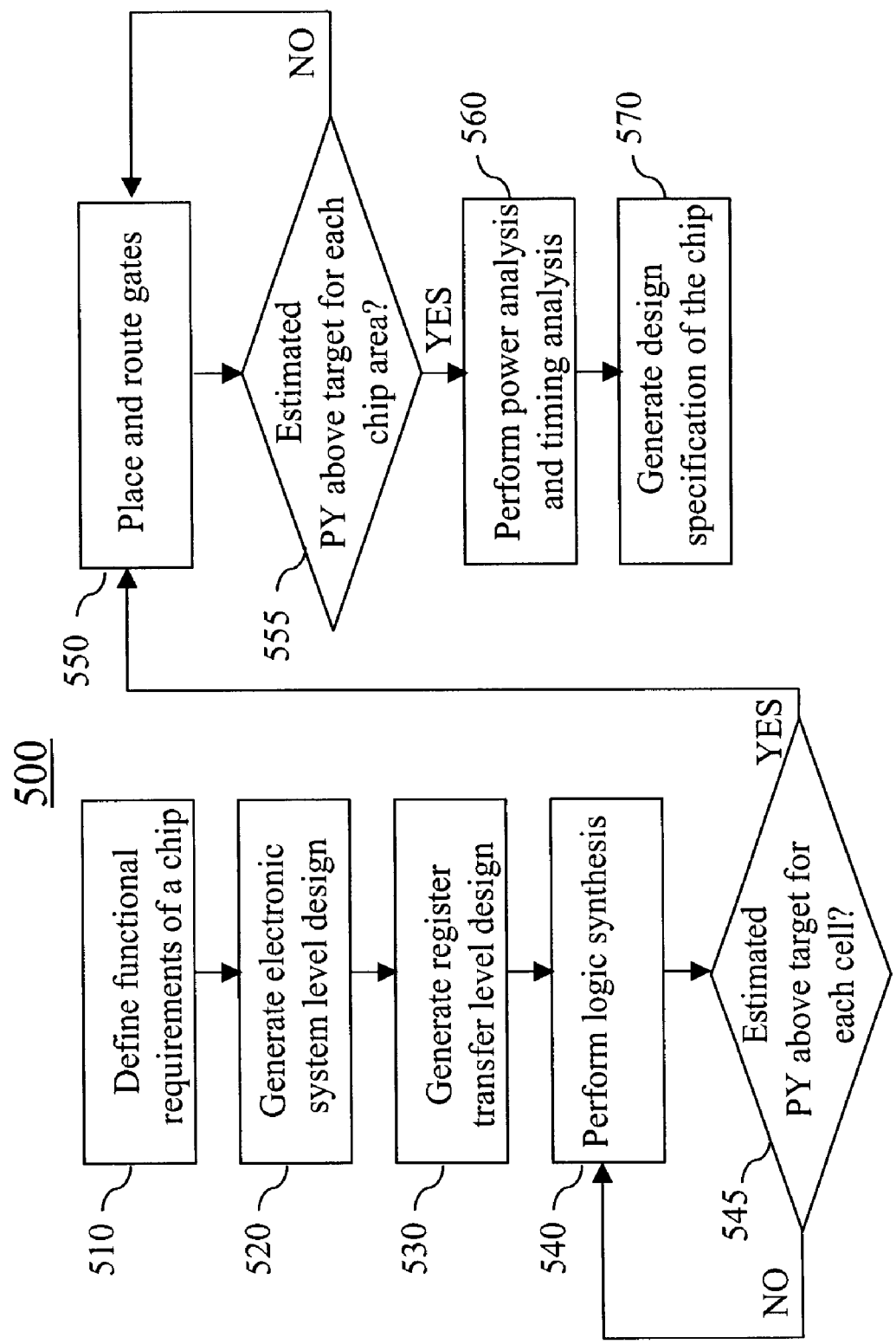
FIG. 5 is a flow chart for operating an exemplary system for designing a semiconductor device that incorporates parametric yield analysis according to the present invention.

Referring to FIG. 5, an exemplary method for designing a semiconductor chip according an aspect of the present invention is shown in a flow chart 500. Referring to step 510, functional requirements of a chip are defined as in step 210 in the flow chart 200 in FIG. 2. Referring to step 520, an electronic system level (ESL) description is generated based on the functional requirements of the chip as in step 220 in the flow chart 200. Referring to step 530, a register transfer level (RTL) description is generated from the electronic system level (ESL) description in the next chip design phase as in the step 230 in the flow chart 200. Referring to step 540, logic synthesis is performed to convert the RTL description in the form of the hardware description language (HDL) into a gate level description of the chip by a logic synthesis tool as in the step 240 in the flow chart 200.

Referring to step 545, parametric value estimation means described above is employed to estimate a parametric yield estimation value for each of at least one subset of the semiconductor chip design in the form of the hardware description language. The parametric yield estimation value may be calculated for each device type, for each region of the semiconductor chip design, for each functional block, and/or for the entirety of the semiconductor chip design. Each of the parametric yield estimation value, which is referred to as "estimated PY" in the flow chart 500, is compared with a corresponding parametric yield target value for the parametric yield of the corresponding subset. If any one of the parametric yield estimation value(s) is/are less than the corresponding parametric yield target value for the parametric yield of the corresponding subset, logic synthesis of the step 540 is re-done for the subset to increase the parametric yield estimation value by improving the semiconductor chip design in the form of the hardware description language. This process may be repeated until each of the at least one subset of the semiconductor chip design generates parametric yield estimation value exceeds the corresponding parametric yield target value.

If all of the parametric yield value(s) exceed(s) the corresponding parametric yield target in the step 545, placement and routing tools utilize the results of the logic synthesis to create a physical layout for the chip in the step 550 as in the step 250 in the flow chart 200.

Referring to step 555, parametric value estimation means described above is employed to estimate a parametric yield estimation value for each of at least one subset of the semiconductor chip design in the form of the physical layout. The parametric yield estimation value may be calculated for each device type, for each region of the semiconductor chip design, for each functional block, and/or for the entirety of the semiconductor chip design. Each of the parametric yield estimation value, which is referred to as "estimated PY" in the flow chart 500, is compared with a corresponding parametric yield target value for the parametric yield of the corresponding subset. If any one of the parametric yield estimation value(s) is/are less than the corresponding parametric yield target value for the parametric yield of the corresponding subset, placement and routing in the step 550 is re-done for the subset to increase the parametric yield estimation value by improving the semiconductor chip design in the form of the physical layout. This process may be repeated until each of the at least one subset of the semiconductor chip design generates parametric yield estimation value exceeds the corresponding parametric yield target value.

If all of the parametric yield value(s) exceed(s) the corresponding parametric yield target in the step 555, power analysis and timing analysis is performed in the step 560 as in the step 260 in the flow chart 200. Referring to step 570, the chip design is analyzed to extract design specification as in the step 270 in the flow chart 200.

According to the present invention, the semiconductor chip design is checked for expected parametric yield level of at least one subset of the semiconductor chip design by estimating a parametric yield estimation value for each of the at least one subset. As noted above, the parametric yield estimation value may be calculated for each device type, for each region of the semiconductor chip design, for each functional block, and/or for the entirety of the semiconductor chip design. The collection of the at least one subset may constitute the entirety of the semiconductor chip design. Since the inventive semiconductor chip design system can check expected parametric yield level of the semiconductor chip design and provides modification of the semiconductor chip design, designers may have reasonable confidence that the parametric yield of manufactured semiconductor chips according to the semiconductor chip design would be at an expected level in a design phase of semiconductor chip manufacturing.

Figure 6:
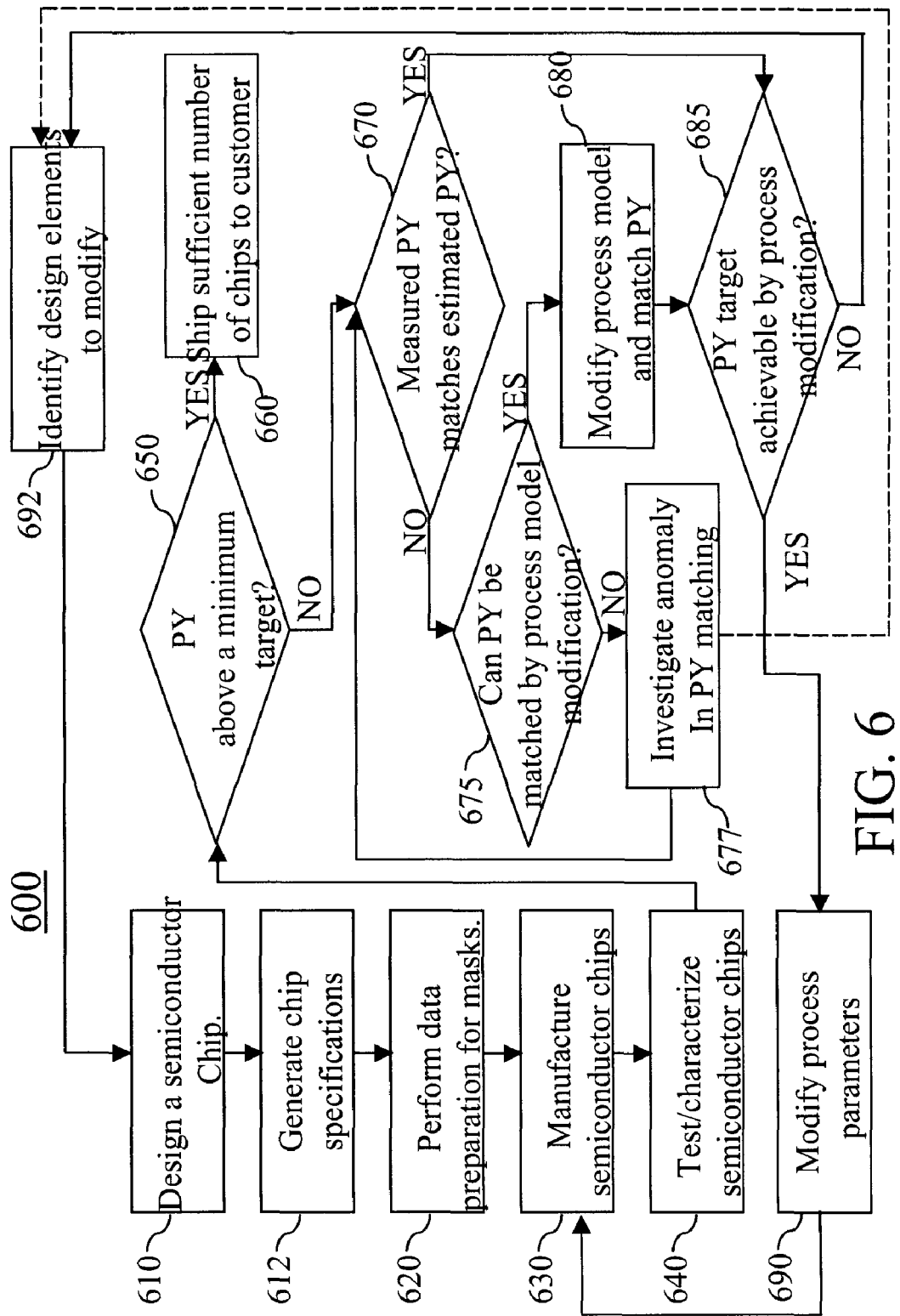
FIG. 6 is a flow chart for operating an exemplary system for analyzing parametric yield of a semiconductor design according to the present invention.

Referring to FIG. 6, an exemplary semiconductor chip manufacturing sequence including the steps of chip design according to another aspect of the present invention is shown in a flow chart 600. Referring to step 610, a semiconductor chip design is provided as described in steps 510-560 of the flow chart 500 in FIG. 5. Referring to step 612, design specification is generated for the chip as in the step 570 of the flow chart 500 in FIG. 5.

Figure 3:
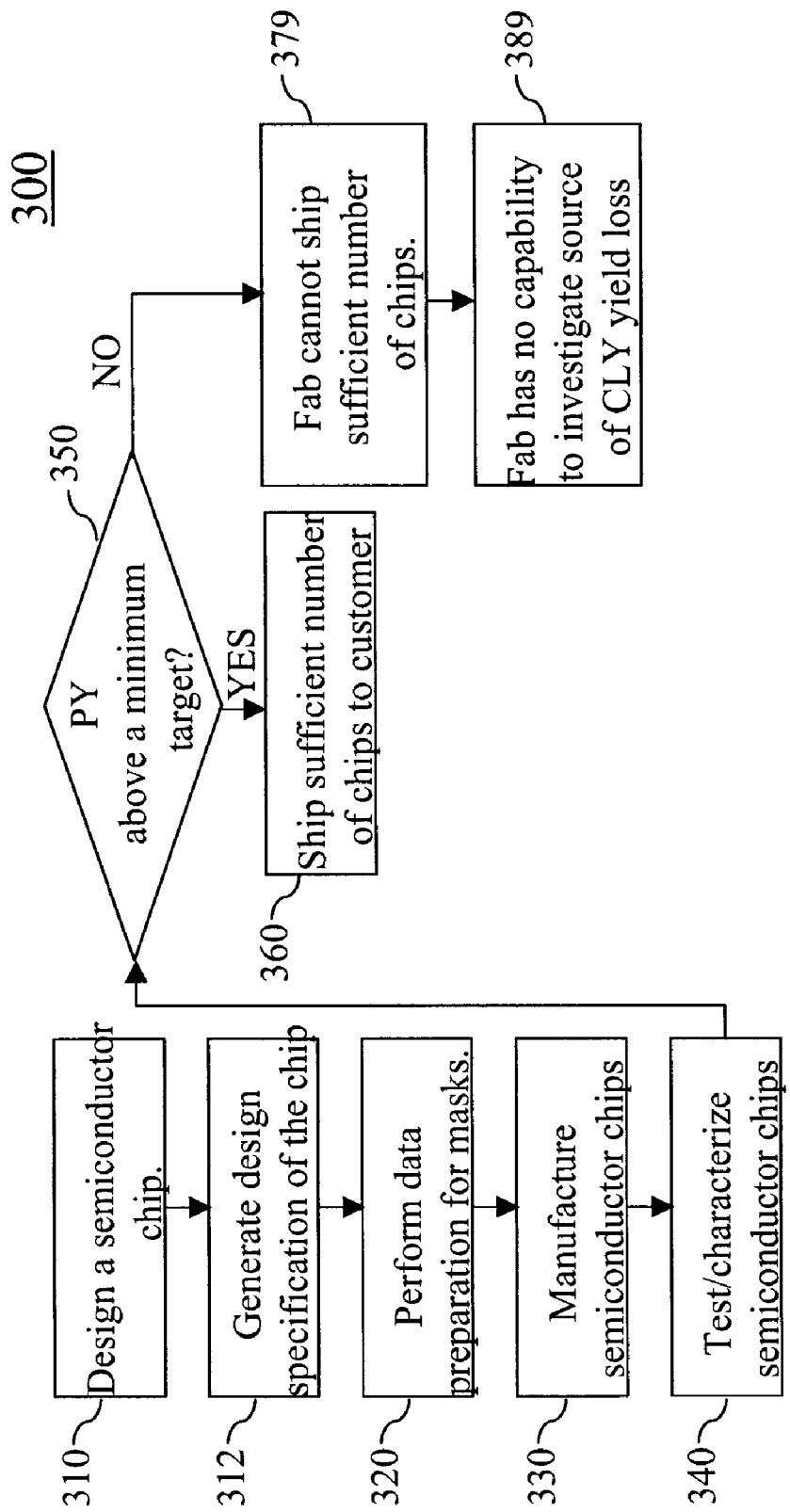
FIG. 3 is a flow chart for a prior art method for manufacturing semiconductor chips based on a semiconductor chip design.

Referring to step 620, data preparation is performed on the chip design to generate various mask levels as in the step 320 of the flow chart 300 in FIG. 3. Referring to step 630, semiconductor chips are manufactured in a semiconductor chip fabrication facility employing various semiconductor processing steps including lithography, deposition, and etching. Referring to step 640, the manufactured semiconductor chips are tested and characterized for functionality. Dysfunctional chips are sorted out. Operating frequency, on-state leakage, and off-state leakage are measured on functional chips.

Referring to step 650, parametric yield, i.e., chip limited yield (CLY), is calculated for the group of semiconductor chips that do not suffer from random defect yield loss or process limited yield loss based on the results of the testing and characterization. Assuming a normal scenario in which the random defect yield loss and the process limited yield loss of the manufacturing process are within expected ranges, delivery of sufficient number of chips to a customer depends on the parametric yield loss. If the parametric yield exceeds a minimum parametric yield target value, sufficient number of chips meeting the design specification may be shipped to a customer, as shown in the step 660.

If the parametric yield is below a minimum target value, analysis on the parametric yield of the semiconductor chip design is performed. Referring to step 670, methods described above may be employed to calculate a parametric yield estimation value for a subset of the semiconductor chip design. As noted above, the parametric yield estimation value may be calculated for each device type, for each region of the semiconductor chip design, for each functional block, and/or for the entirety of the semiconductor chip design. Consequently, comparison of a measured parametric yield value and a corresponding parametric yield estimation value may be performed each device type, for each region of the semiconductor chip design, for each functional block, and/or for the entirety of the semiconductor chip design. For any given subset of the semiconductor chip design, the measured parametric yield value of the semiconductor chip is compared with the corresponding parametric yield estimation value.

The comparison of the measured parametric yield value and the corresponding parametric yield estimation value may be performed manually, or preferably, may be performed by parametric yield comparison means, which may be a program dedicated to comparison of the two parameters, or may be a program incorporated into a test program or a characterization program.

Referring to step 685, in case the measured parametric yield value and the corresponding parametric yield estimation value match, which would imply that the original semiconductor chip design was designed to achieve the parametric yield of the measured parametric yield value, methods of enhancing parametric yield on future semiconductor chips may be explored. It is noted that employing a system or methods of estimating at least one parametric yield estimation value as describe abode according to the present invention can prevent this scenario by modifying the semiconductor chip design in the design phase. A process model is utilized to determine if process parameters, such as a dimension or composition of a physical component of a semiconductor chip, may be modified to increase the parametric yield of semiconductor chips in manufacturing or to be manufactured in the future to the minimum target value for the parametric yield. The process model is a set of assumptions or a program based on the set of assumptions for correlating process parameters of semiconductor processing steps employed during manufacturing of the semiconductor chips with measured parametric yield value.

Referring to step 690, in case the modification of some process parameters is deemed to be capable of increasing the parametric yield of semiconductor chips to be subsequently manufactured above the minimum target value of the parametric yield, the process parameters are modified. The step 60 is repeated to manufacture more semiconductor chips with the modified process parameters. The parametric yield of a new batch of semiconductor chips is expected to be above the minimum target value upon execution of a second iteration of the step 640 for test and characterization of the semiconductor chips and the step 650 for comparison of measured parametric yield value and the minimum target value for the parametric yield.

Referring to step 692, in case the modification of process parameters is deemed incapable of increasing the parametric yield of semiconductor chips to be subsequently manufactured above the minimum target value of the parametric yield, at least one design element to modify is identified and modification to the original semiconductor chip design is performed. The semiconductor chip design is modified employing the step 610 again and subsequent steps described above are repeated. In this case, the set of at least one parametric yield estimation value for a subset of the semiconductor chip design may be advantageously employed to identify the at least one design element to be modified. The at least one design element to be modified may be at least one device type, at least one region of the semiconductor chip design, and/or at least one functional block of the semiconductor chip design to be modified.

In case the measured parametric yield value and the corresponding parametric yield estimation value does not match at the step 670, which would imply that the process model is not accurate or there is an anomaly in the parametric yield caused by a yet undetected error in the semiconductor chip design or in the manufacturing process employed to manufacture the tested semiconductor chips, the cause of the mismatch is investigated. Referring to step 675, it is determined whether the mismatch between the measured parametric yield value and the corresponding parametric yield estimation value may be resolved by modifications to the process model. Process model fitting means may be employed to attempt resolving the discrepancy between the parametric model estimation value and the measured parametric yield value by altering process model parameters, i.e., parameters in the process model. To effect a resolution of the discrepancy if possible, a measured process parameter database that stores measured process parameter values that are measured during manufacturing of the semiconductor chips may be employed. The process model fitting means alters the process model parameters and measures the effectiveness of the process model for each setting of the process model parameters as variations in the measured process parameter values are correlated with the measured parametric yield value by the process model. The effectiveness of the process model may be measured, for example, by goodness of fit, correlation coefficients, or by another measure of degree of success in statistical fitting.

Thus, the process model fitting means is employed to improve accuracy of the process model employing the measured process parameter values in the measured process parameter database. The process model fitting means may be a dedicated program for fitting, or resolving, the discrepancy between the parametric yield estimation value and the measured parametric yield value. Alternatively, the process model fitting means may be incorporated in a yield analysis program incorporating other programs. In case the measured parametric yield value and the corresponding parametric yield estimation value may be matched by reasonable and verifiable changes in the process model parameters in the process model, the process model is modified with the best-fitting process model parameters at step 680. Subsequently, the step 685 is performed to explore methods of enhancing parametric yield on future semiconductor chips. The process flow thereafter is the same as described above.

Referring to step 677, in case the measured parametric yield value and the corresponding parametric yield estimation value may not be matched by reasonable and verifiable changes in the process model parameters in the process model, the likelihood of an anomaly in the parametric yield caused by a yet undetected error in the semiconductor chip design or in the manufacturing process employed to manufacture the tested semiconductor chips is deemed to be sufficiently high. Consequently, methods to investigate the anomaly in the parametric yield are employed at this point. Once the anomaly is identified, the step 670 may be repeated by comparing a newly estimated parametric yield estimation value based on findings on the anomaly with the measured parametric yield value. Alternatively, the step 692 may be performed to identify at least one design element to modify, and modification to the original semiconductor chip design may be performed as described above.

The present invention provides a semiconductor chip manufacturing facility a system and methods for investigation of the source of the depressed parametric yield. The inventive system and methods may be employed upon discovery of depressed parametric yield that does not meet a target, or may be preemptively employed concurrently with or prior to production of semiconductor chips. Further, systematic methods are provided for handling a parametric yield that does not meet a target value.

Figure 7:
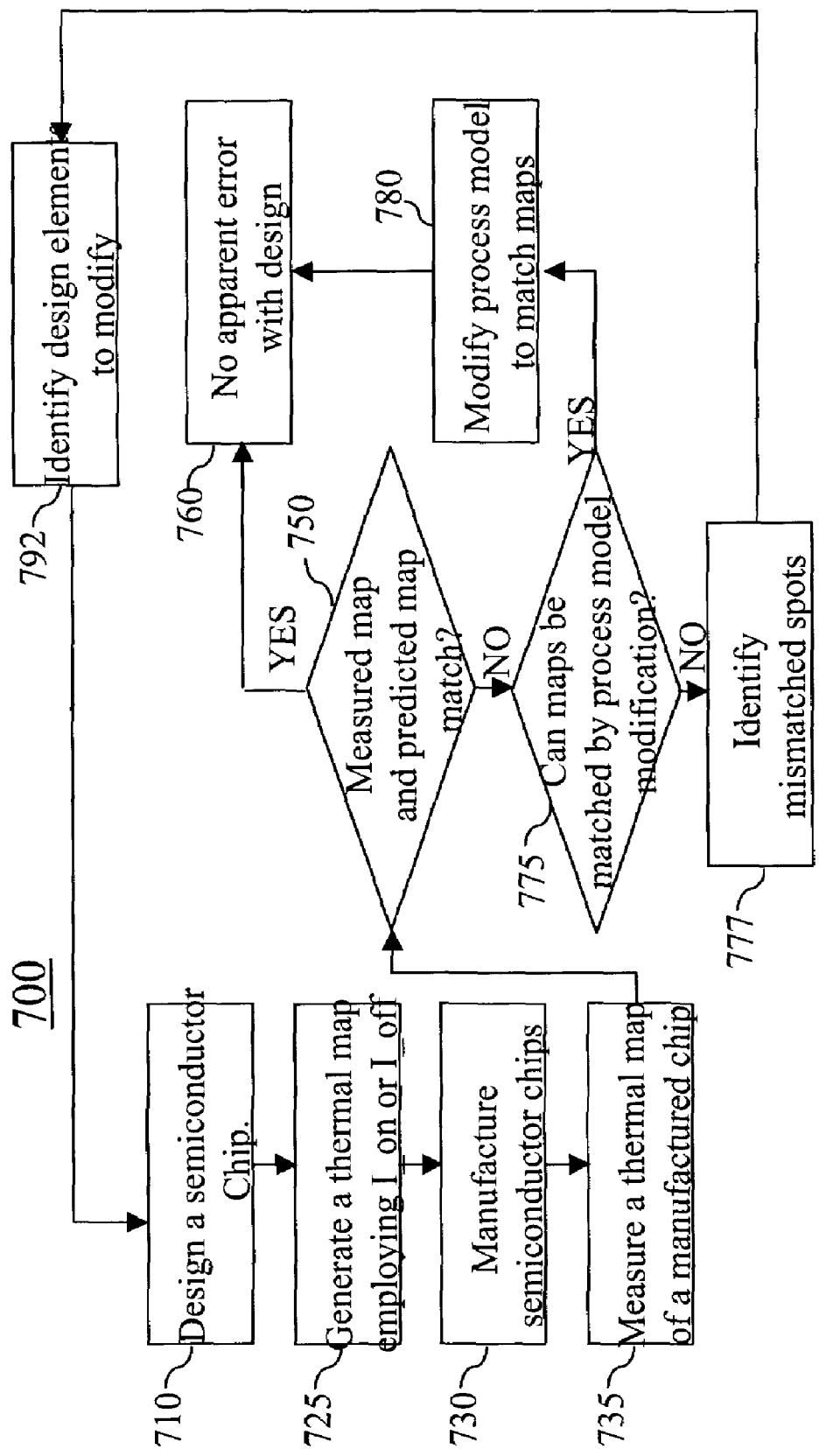
FIG. 7 is a flow chart for operating an exemplary system for identifying a location of anomalous functionality on a semiconductor chip according to the present invention.

Referring to FIG. 7, an exemplary sequence for identifying a location of anomalous functionality of a semiconductor chip according to yet another aspect of the present invention is shown in a flow chart 700. The location of anomalous functionality may be the location of the anomaly in the parametric yield at the step 677 described above.

Referring to step 710, a semiconductor chip design is provided as described in steps 510-560 of the flow chart 500 in FIG. 5.

Referring to step 725, on-current distribution calculation means may be employed to calculate spatial distribution of on-current within the semiconductor chip. Alternately or in parallel, off-current distribution means may be employed to calculate spatial distribution of off-current within the semiconductor chip. The spatial distribution of on-current and the spatial distribution of off-current within the semiconductor chip are collectively referred to as "current maps" of the semiconductor chip. The spatial distribution of on-current is a map of the density of on-current in the semiconductor chip. The spatial distribution of off-current is a map o the density of off-current in the semiconductor chip. The on-current distribution calculation means and the off-current distribution calculation means are as described above.

Current-to-temperature conversion means are employed to convert at least one of the spatial distribution of on-current and the spatial distribution of off-current into an estimated spatial temperature distribution map, which is herein referred to as a "thermal map." Current-to-temperature conversion means may be a stand-alone program that is dedicated to calculation of a temperature distribution map of the semiconductor chip, and may reside in a computer. Alternately, the current-to-temperature conversion means may be integrated into a system, which may include other automated programs, for designing a semiconductor chip or for diagnosing parametric yield of semiconductor chips.

Referring to step 730, semiconductor chips are manufactured in a semiconductor chip fabrication facility employing various semiconductor processing steps including lithography, deposition, and etching. Referring to step 735, a measured temperature distribution map is generated by measuring at least one of manufactured semiconductor chips in an on-state or in an off-state.

Referring to step 750, the estimated spatial temperature distribution map and the measured temperature distribution map are compared to determine whether the two maps match. Referring to step 760, in case the two maps match, the semiconductor chip design is deemed to be free of any apparent design error as determined by the inventive system and methods.

Referring to step 775, in case the two maps do not match, it is determined whether the mismatch between the two maps may be resolved by modifications to the process model. Process model fitting means may be employed to attempt resolving the discrepancy between the two maps by altering process model parameters, i.e., parameters in the process model as described above. The process model fitting means is the same as described above. The process model fitting means is employed to improve accuracy of the process model employing the measured process parameter values in the measured process parameter database. In this case, however, the process model fitting means may be a dedicated program resolving the discrepancy between the estimated spatial temperature distribution map and the measured temperature distribution map instead of resolving a discrepancy between a parametric yield estimation value and a measured parametric yield value. Alternatively, the process model fitting means may be incorporated in a characterization program that may also incorporate other programs.

In case the two maps may be matched by reasonable and verifiable changes in the process model parameters in the process model, the process model is modified with the best-fitting process model parameters at step 780. Since the two maps match after modification of the process model parameters, the semiconductor chip design is deemed to be free of any apparent design error as determined by the inventive system and methods as in the step 760.

Referring to step 777, in case the two maps may not be matched by reasonable and verifiable changes in the process model parameters in the process model, mismatched spots are identified. It is noted herein that identification of the mismatched spots may be a methods to investigate the anomaly in the parametric yield described above.

Referring to step 792, at least one design element to modify is identified based on the location of the mismatched spots. The semiconductor chip design is modified employing the step 710 again and subsequent steps described above are repeated. In this case, the identification of the physical location of the mismatched spots is advantageously employed to identify the at least one design element to be modified. The at least one design element to be modified may be at least one device type, at least one region of the semiconductor chip design, and/or at least one functional block of the semiconductor chip design to be modified.

Figure 8:
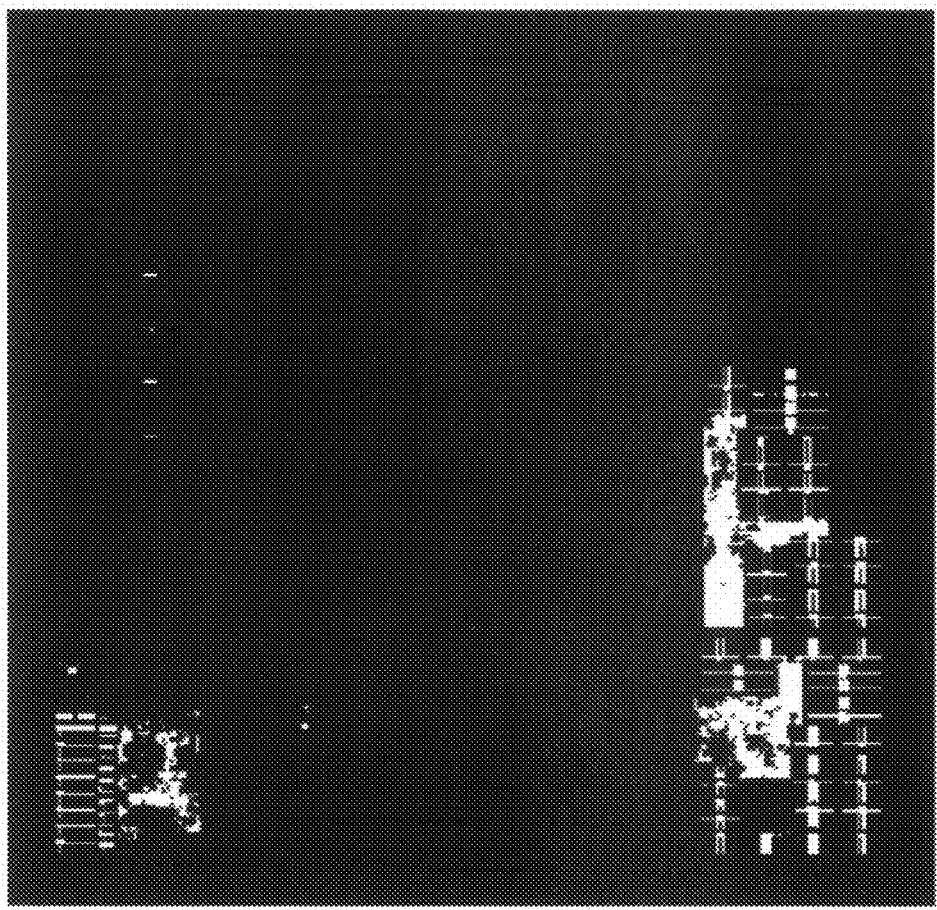
FIG. 8 is an estimated spatial temperature distribution map for a semiconductor chip derived from a corresponding semiconductor chip design according to the present invention.

Referring to FIG. 8, an exemplary estimated spatial temperature distribution map for a semiconductor chip design obtained by the inventive method is shown, in which low temperature regions are shown in black and high temperature regions are shown in white.

Figure 9:
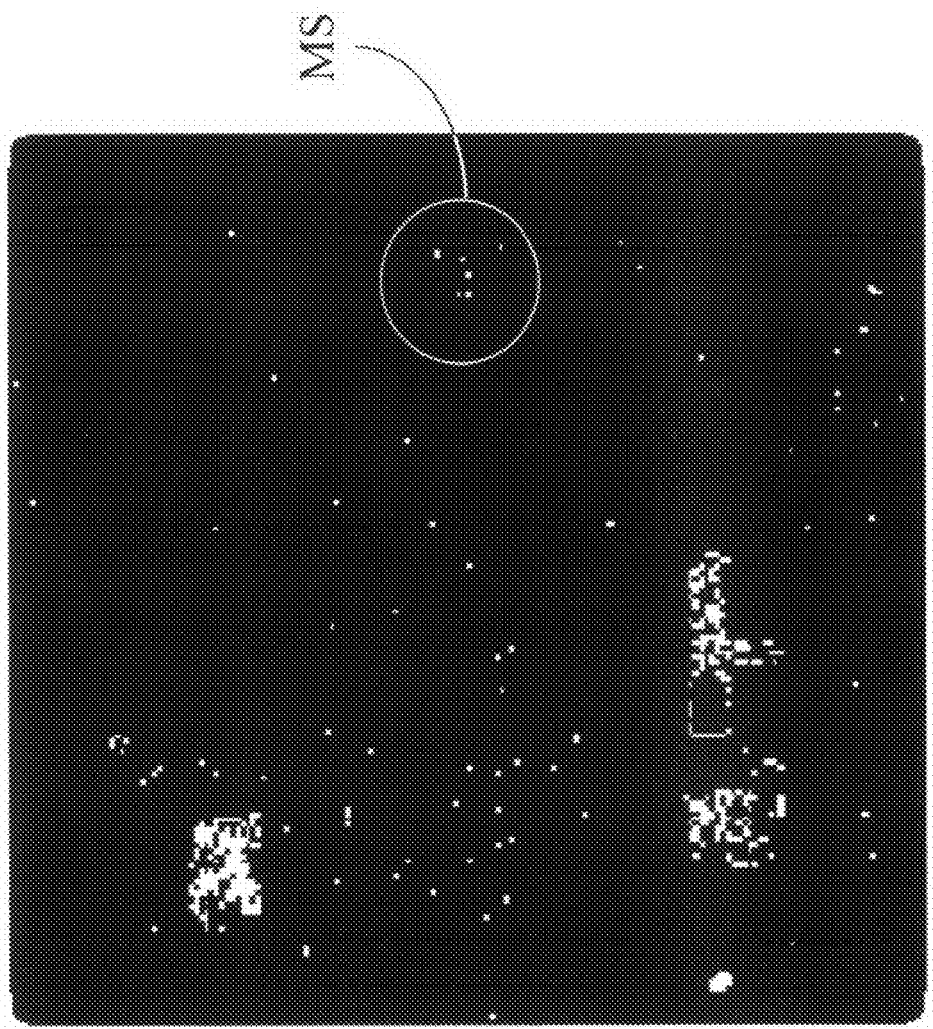
FIG. 9 is a measured temperature distribution map measured on a semiconductor chip.

Referring to FIG. 9, an exemplary measured temperature distribution map for a semiconductor chip manufactured using the semiconductor chip design of FIG. 8 is shown, in which low temperature regions are shown in black and high temperature regions are shown in white. Anomalous mismatches are found in some areas, which are mismatched spots. One of the mismatched spots is labeled with "MS."

The comparison of an estimated spatial temperature distribution map and a measured temperature distribution map may be performed manually, or preferably, by an automated system employing temperature distribution comparison means. The temperature distribution comparison means may be a program that receives the estimated spatial temperature distribution map and the measured temperature distribution map as input data and performs image processing to produce coordinates of mismatched spots. The inventive method provides a system and methods for identifying a location of anomalous functionality to facilitate debugging of a semiconductor chip design.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims. Zone Name: A1,AMD if said parametric yield estimation value does not exceed a predetermined target for said parametric yield estimation value, iteratively modifying said netlist or chip layout and repeating said estimating a parametric yield estimation value until a most recent parametric yield estimation value exceeds the predetermined target for said parametric yield estimation value; and

What is claimed is:

1. A method of designing and manufacturing a set of physical masks for a semiconductor chip comprising:

providing one or more of a program or a compact model either or both of which including a threshold voltage adder calculation means;

determining, employing said threshold voltage adder calculation means, a calculated threshold voltage adder for a device within a subset of a semiconductor chip design including an effect of at least one design parameter of said subset other than inherent geometric dimensions and inherent characteristics of said device;

estimating a parametric yield estimation value of said subset of said semiconductor chip design, wherein said parametric yield estimation value is based on said calculated threshold voltage adder;

iteratively modifying, if said parametric yield estimation value does not exceed a predetermined target for said parametric yield estimation value, said semiconductor design and estimating said parametric yield estimation value until a most recent parametric yield estimation value exceeds a predetermined target for said parametric yield estimation value; and manufacturing, employing data representing said semiconductor chip design as most recently provided or modified, a set of physical masks for said semiconductor chip design, wherein said determining of said calculated threshold voltage adder is effected by performing at least one step of:

calculating an incremental on-current deviation for said subset of said semiconductor chip design, wherein said incremental on-current deviation is an increment in statistical deviation of on-current of said subset of said semiconductor chip deign from a scaling-estimated statistical deviation of on-current, which is obtained by scaling of statistical deviation of on-current of at least one nominal device, due to said design parameters of said subset other than inherent geometric dimensions and inherent characteristics of devices in said subset; and calculating an incremental off-current deviation for said subset of said semiconductor chip design, wherein said incremental off-current deviation is an increment in statistical deviation of off-current of said subset of said semiconductor chip deign from a scaling-estimated statistical deviation of off-current, which is obtained by scaling of statistical deviation of off-current of at least one nominal device, due to said design parameters of said subset other than inherent geometric dimensions and inherent characteristics of devices in said subset.

2. The method of claim 1, wherein said subset comprises a cell containing one functional semiconductor device unit within said semiconductor chip design or a plurality of semiconductor device units within said semiconductor chip design.

3. The method of claim 1, wherein said design parameters of said subset comprises at least one of positional relationship between an element of said subset and another element of said subset and positional relationship between an element of said subset and another element of another subset in said semiconductor chip design.

4. The method of claim 1, further comprising:

performing logic synthesis to generate a netlist of said semiconductor chip design, wherein said semiconductor design is said netlist; and controlling flow of a sequence of said iterative modification, wherein a flow control means directs said controlling of said flow to a step in which said netlist is modified if said parametric yield estimation value does not a exceed said predetermined target.

5. The method of claim 1, further comprising:

placing and routing a netlist of said semiconductor chip design to generate a chip layout, wherein said semiconductor design is said chip layout; and controlling flow of a sequence of said iterative modification, wherein a flow control means directs said controlling of said flow to a step in which said chip layout is modified if said parametric yield estimation value does not exceed said predetermined target.

6. The method of claim 1, further comprising at least one of:

determining an incremental on-current deviation for said subset of said semiconductor chip design, wherein said incremental on-current deviation is an increment in statistical deviation of on-current of said subset of said semiconductor chip deign from a scaling-estimated statistical deviation of on-current, which is obtained by scaling of statistical deviation of on-current of at least one nominal device, due to said design parameters of said subset other than inherent geometric dimensions and inherent characteristics of devices in said subset; and determining an incremental off-current deviation for said subset of said semiconductor chip design, wherein said incremental off-current deviation is an increment in statistical deviation of off-current of said subset of said semiconductor chip deign from a scaling-estimated statistical deviation of off-current, which is obtained by scaling of statistical deviation of off-current of at least one nominal device, due to said design parameters of said subset other than inherent geometric dimensions and inherent characteristics of devices in said subset.

7. The method of claim 6, further comprising at least one of:

determining statistical distribution of on-current within said subset; and determining statistical distribution of off-current within said subset.

8. The method of claim 7, further comprising at least one of:

determining on-state temperature distribution of a semiconductor chip manufactured with said semiconductor design; and determining off-state temperature distribution of said semiconductor chip manufactured with said semiconductor design.

9. The method of claim 8, wherein said on-state temperature distribution is calculated based on said statistical distribution of said on-current within said subset, and wherein said off-state temperature distribution is calculated based on said statistical distribution of said off-current within said subset.

10. A method of manufacturing semiconductor chips, said method comprising:

providing one or more of a program or a compact model either or both of which including a threshold voltage adder calculation means;

determining, employing said threshold voltage adder calculation means, a calculated threshold voltage adder for a device within a subset of a semiconductor chip design including an effect of at least one design parameter of said subset other than inherent geometric dimensions and inherent characteristics of said device;

estimating a parametric yield estimation value of said subset of said semiconductor chip design, wherein said parametric yield estimation value is based on said calculated threshold voltage adder;

generating at least one measured parametric yield value by testing at least one semiconductor chip that is manufactured according to said semiconductor chip design;

comparing said parametric yield estimation value and said at least one measured parametric yield value;

iteratively modifying, if said parametric yield estimation value does not exceed a predetermined target for said parametric yield estimation value, at least one of process parameters and said semiconductor design until a most recent parametric yield estimation value exceeds a predetermined target for said parametric yield estimation value; and manufacturing semiconductor chips employing said semiconductor chip design as most recently provided or modified and said process parameters as most recently provided or modified, wherein said determining of said calculated threshold voltage adder is effected by performing at least one step of:

calculating an incremental on-current deviation for said subset of said semiconductor chip design, wherein said incremental on-current deviation is an increment in statistical deviation of on-current of said subset of said semiconductor chip deign from a scaling-estimated statistical deviation of on-current, which is obtained by scaling of statistical deviation of on-current of at least one nominal device, due to said design parameters of said subset other than inherent geometric dimensions and inherent characteristics of devices in said subset; and calculating an incremental off-current deviation for said subset of said semiconductor chip design, wherein said incremental off-current deviation is an increment in statistical deviation of off-current of said subset of said semiconductor chip deign from a scaling-estimated statistical deviation of off-current, which is obtained by scaling of statistical deviation of off-current of at least one nominal device, due to said design parameters of said subset other than inherent geometric dimensions and inherent characteristics of devices in said subset.

11. The method of claim 10, wherein said design parameters of said subset comprises at least one of positional relationship of an element of said subset to another element of said subset and positional relationship of an element of said subset to another subset in said semiconductor chip design.

12. The method of claim 10, further comprising at least one of:
determining statistical distribution of on-current within said subset; and
determining statistical distribution of off-current within said subset.

13. The method of claim 10, further comprising:
storing measured process parameter values that are measured during manufacturing of said at least one semiconductor chip;
correlating variations in said measured process parameter values with said at least one measured parametric yield value with a process model; and
fitting discrepancy between said parametric yield estimation value and said at least one measured parametric yield value with said measured process parameter values to improve accuracy of said process model.

14. The method of claim 10, further comprising simulating a change in said parametric estimation value in response to changes in said design parameter.

15. The method of claim 10, further comprising:
for each of said at least one measured parametric yield value that matches a corresponding parametric yield estimation value, modifying process parameters employed in at least one processing step to increase the corresponding parametric yield estimation value; and
for each of said at least one measured parametric yield value that does not match a corresponding parametric yield estimation value, resolving at least one discrepancy between said at least one measured parametric yield value and said corresponding parametric yield estimation value by altering process model parameters in a process model.

16. The method of claim 15, further comprising performing, if said at least one discrepancy between said at least one measured parametric yield value and said corresponding parametric yield estimation value cannot be resolved by altering said process model parameters in said process model, at least one of:

checking said semiconductor chip design for a yet undetected error; and
modifying at least one design element in said semiconductor chip design.

17. A method of designing and manufacturing a set of physical masks for a semiconductor chip comprising:
providing one or more of a program or a compact model, either or both of which including a threshold voltage adder calculation means;
generating, in a form of a netlist or a chip layout, a semiconductor chip design;
determining, employing said threshold voltage adder calculation means, a calculated threshold voltage adder for a device within a subset of said semiconductor chip design including an effect of at least one design parameter of said subset other than inherent geometric dimensions and inherent characteristics of said device;
estimating a parametric yield estimation value of said subset of said semiconductor chip design, wherein said parametric yield estimation value is based on said calculated threshold voltage adder;
if said parametric yield estimation value does not exceed a predetermined target for said parametric yield estimation value, iteratively modifying said netlist or chip layout and repeating said estimating a parametric yield estimation value until a most recent parametric yield estimation value exceeds the predetermined target for said parametric yield estimation value; and
manufacturing a set of physical masks for said semiconductor chip design employing data representing said semiconductor chip design as most recently modified.

18. The method of claim 17, further comprising at least one of calculating an average on-current adder for said subset of said semiconductor chip design; and
calculating an average off-current adder for said subset of said semiconductor chip design, wherein said average on-current adder is an average deviation of on-current of said subset from a scaling-estimated on-current, which is obtained by scaling of at least one nominal device, due to said design parameters of said subset other than inherent geometric dimensions and inherent characteristics of said device, and wherein said average off-current adder is an average deviation of off-current of said subset from a scaling-estimated off-current, which is obtained by scaling of at least one nominal device, due to said design parameters of said subset other than inherent geometric dimensions and inherent characteristics of said device, and wherein said parametric yield estimation value is based on at least one of said average on-current adder and said average off-current adder.

19. The method of claim 17, wherein said subset comprises a cell containing one functional semiconductor device unit within said semiconductor chip design or a plurality of semiconductor device units within said semiconductor chip design.

20. The method of claim 17, wherein said design parameters of said subset comprises at least one of positional relationship between an element of said subset and another element of said subset and positional relationship between an element of said subset and another element of another subset in said semiconductor chip design.

* * * * *